(12) United States Patent
Kang

(10) Patent No.: US 6,356,476 B1
(45) Date of Patent: Mar. 12, 2002

(54) SENSING AMPLIFIER OF NONVOLATILE FERROELECTRIC MEMORY DEVICE

(75) Inventor: Hee Bok Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/620,600

(22) Filed: Jul. 20, 2000

(30) Foreign Application Priority Data

Jul. 21, 1999 (KR) .............................................. 99-29646

(51) Int. Cl.[7] .............................................. G11C 11/22
(52) U.S. Cl. ........................... 365/145; 365/65; 365/63; 365/205
(58) Field of Search ........................... 365/145, 65, 63, 365/129, 189.01, 205

(56) References Cited

U.S. PATENT DOCUMENTS

| 4,873,664 | A |   | 10/1989 | Eaton, Jr. ................... 365/145 |
|---|---|---|---|---|
| 5,515,315 | A | * | 5/1996 | Uda et al. ................... 365/174 |
| 6,011,738 | A |   | 1/2000 | Son et al. ................... 365/207 |
| 6,034,912 | A | * | 3/2000 | Isomura et al. ......... 365/230.03 |
| 6,064,612 | A | * | 5/2000 | Agata ......................... 365/207 |
| 6,188,599 | B1 | * | 2/2001 | Kang ......................... 365/145 |
| 6,188,624 | B1 | * | 2/2001 | Zheng ........................ 365/207 |

* cited by examiner

Primary Examiner—Hoai V. Ho
(74) Attorney, Agent, or Firm—Fleshner & Kim, LLP

(57) ABSTRACT

A sensing amplifier of a nonvolatile ferroelectric memory device is provided in which a data bus is commonly used to read and write data. Thus, the sensing amplifier does not use separate data buses to increase stability in amplification. The sensing amplifier of a nonvolatile ferroelectric memory device has three-stage amplification that amplifies the signals of bitlines of the memory device. A first amplification stage amplifies the signals of the bitlines, a first data bus is commonly used to read and write the data and can transfer an output signal of the first amplification stage, and a second amplification stage that can amplify a signal of the first data bus. A second data bus is commonly used to read and write the data and can transfer an output signal of the second amplification stage, and a third amplification stage amplifies a signal of the second data bus.

22 Claims, 19 Drawing Sheets

SENSING AMPLIFIER OF NONVOLATILE FERROELECTRIC MEMORY DEVICE

BACKGROUND OF THE INVENTION

1. Field of the Invention

The present invention relates to a nonvolatile ferroelectric memory device, and more particularly, to a sensing amplifier of a nonvolatile ferroelectric memory device.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

The reading operation of data stored in a cell by the above operation of the write mode will now be described. If an externally applied chip enable signal CSBpad is activated from high state to low state; all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

FIG. 4 is a block diagram showing the related art nonvolatile ferroelectric memory device. As shown in FIG. 4, the related art nonvolatile ferroelectric memory device includes a main cell array 41, a reference cell array 42 assigned on a lower part of the main cell array 41, a wordline driver 43 formed at a side of the main cell array for applying a driving signal to the main cell array 41 and the reference cell array 42, and a sensing amplifier 44 formed at a lower part of the reference cell array 42.

The wordline driver 43 applies the driving signal to a main wordline of the main cell array 41 and a reference wordline of the reference cell array 42. The sensing amplifier 44 includes a plurality of sensing amplifiers and amplifies signals of a corresponding bitline B/L and bit bar line BB/L.

The operation of the related art nonvolatile ferroelectric memory device will now be described with reference to FIG. 5. FIG. 5 is a partially detailed view of FIG. 4. As shown in the drawing, the main cell array has a folded bitline structure in the same manner as DRAM.

Also, the reference cell array 42 has a folded bitline structure and includes a reference cell wordline and a reference cell plate line in pairs. At this time, reference cell wordline and the reference cell plate line pairs are defined as RWL_1 and RPL_1, and RWL_2 and RPL_2, respectively.

When the main cell wordline MWL_N-1 and the main plate line MPL_N-1 are activated, the reference cell wordline RWL_1 and the reference cell plate line RPL_1 are activated. Therefore, data in the main cell is loaded into the bitline B/L and data in the reference cell is loaded into the bit bar line BB/L.

When the main cell wordline MWL_N and the main cell plate line MPL_N are activated, the reference cell wordline RWL_2 and the reference cell plate line RPL_2 are activated. Therefore, data in the main cell is loaded into the bit bar line BB/L and data in the reference cell is loaded into the bitline B/L.

The reference voltage REF by the reference cell exists between the bitline levels B_H (high) and B_L(low) by the main cell. To generate the reference voltage REF between the bitline levels B_H and B_L, the logic value "1" or "0" may be stored in a capacitor of the reference cell. When the logic value "1" is stored in the capacitor of the reference cell, the size of the capacitor of the reference cell is smaller than that of the capacitor of the main cell. When the logic value "0" is stored in the capacitor of the reference cell, the size of the capacitor of the reference cell is greater than that of the capacitor of the main cell.

FIG. 6 is a diagram illustrating one of the plurality of sensing amplifiers constituting the sensing amplifier of FIG. 4. As shown in FIG. 6, the related art sensing amplifier has a structure of a latch type sensing amplifier.

In other words, the sensing amplifier in FIG. 6 includes two PMOS transistors and two NMOS transistors, and these PMOS and NMOS transistors have latch type inverter structures. The first PMOS transistor MP1 and the second PMOS transistor MP2 face each other. An output terminal of the first PMOS transistor MP1 is connected to a gate of the second PMOS transistor MP2, and an output terminal of the second PMOS transistor MP2 is connected to a gate of the first PMOS transistor MP1. An SAP signal is commonly applied to input terminals of the first and second PMOS transistors MP1 and MP2. The SAP signal is an active signal that activates the first and second PMOS transistors MP1 and MP2.

The first NMOS transistor MN1 is connected to the output terminal of the first PMOS transistor MP1 in series. The second NMOS transistor MN2 is connected to the output terminal of the second NMOS transistor MN2 in series. The output terminal of the second NMOS transistor MN2 is connected to a gate of the first NMOS transistor MN1, and the output terminal of the first NMOS transistor MN1 is connected to a gate of the second NMOS transistor MN2.

An SAN signal is commonly applied to input terminals of the first and second NMOS transistors MN1 and MN2. The SAN signal is an active signal that activates the first and second NMOS transistors MN1 and MN2.

The output terminals of the first PMOS transistor MP1 and first NMOS transistor MN1 are commonly connected to the bitline B_N. The output terminals of the second PMOS transistor MP2 and the second NMOS transistor MN2 are connected to the next bitline B_N+1.

The output of the sensing amplifier is respectively connected to the bitlines B_N and B_N+1 to be input and output to the main cell and the reference cell, respectively, thereby enabling input/output to the main cell and the reference cell.

The SAP signal, the SAN signal, and the signals of B_N and B_N+1 are all maintained at ½ Vcc for a precharge period when the sensing amplifier is not active. On the other hand, the SAP signal is pulled-up at high level and the SAN signal is pulled-down at low level.

As described above, the related art nonvolatile ferroelectric memory device has various disadvantages. Since the reading and writing operation of data is performed using different data buses, a plurality of data buses are required. Accordingly, efficient layout of the FRAM is difficult. In addition, stability is decreased in amplification during reading and writing operation.

SUMMARY OF THE INVENTION

An object of the present invention is to provide a sensing amplifier of a nonvolatile ferroelectric memory device that substantially obviates one or more of the problems caused by limitations and disadvantages of the related art.

Another object of the present invention is to provide a sensing amplifier that amplifies cell data using three stages in a nonvolatile ferroelectric memory device.

Another object of the present invention is to provide a sensing amplifier in a nonvolatile ferroelectric memory device that uses a single data bus for reading and writing operations.

Another object of the present invention is to provide a sensing amplifier in a nonvolatile ferroelectric memory device that has a reduced size.

Another object of the present invention is to provide a sensing amplifier in a nonvolatile ferroelectric memory device that has an increased stability in amplification during reading and writing operations.

Another object of the present invention is to provide a sensing amplifier of a nonvolatile ferroelectric memory device in which a data bus is commonly used when reading and writing data to obviate separate data buses and increase stability in amplification.

To achieve at least the above objects and other advantages in a whole or in part and in accordance with the purpose of the present invention, as embodied and broadly described, a sensing amplifier of a nonvolatile ferroelectric memory device having three-stage amplification portions for amplifying signals of bitlines, according to the present invention includes a first amplification stage that amplifies the signals of the bitlines, a first data bus commonly used for reading and writing of data that transfers an output signal of the first amplification stage, a second amplification stage that amplifies a signal of the first data bus, a second data bus commonly used for reading and writing of data that transfers an output signal of the second amplification stage and a third amplification stage that amplifies a signal of the second data bus.

To achieve at least the above objects and other advantages in a whole or in part and in accordance with the purpose of the present invention, as embodied and broadly described, a sensing amplifier of a nonvolatile ferroelectric memory device that includes a first amplification stage that amplifies signals of a plurality of bitlines, a first data bus that transfers a first signal to and from the first amplification stage for writing and reading of data, respectively, a second amplification stage that amplifies the first signal of the first data bus, a second data bus that transfers a second signal to and from the second amplification stage for writing and reading of data, respectively, and a third amplification stage that amplifies the second signal of the second data bus.

To achieve at least the above objects and other advantages in a whole or in part and in accordance with the purpose of the present invention, as embodied and broadly described, a memory device that includes a plurality of cell arrays in a matrix arrangement, first amplification stages respectively positioned at lower and upper portions of a corresponding one of the cell arrays, first data buses commonly coupled to the first amplification stages disposed on the same row of the plurality of cell arrays, wherein the first data buses transfers signals of the first amplification stages, a second amplification stage that amplifies the signals transmitted through the first amplification stage, first switches coupled with one of the first and second amplification stages to switch output signals thereof, a third data bus that transfers the output signals of the second amplification stage, and a third amplification stage that amplifies signals of the third data bus.

To achieve at least the above objects and other advantages in a whole or in part and in accordance with the purpose of the present invention, as embodied and broadly described, a nonvolatile ferroelectric memory device that includes a first split wordline driver, first and second cell arrays, wherein the first split wordline driver is between the cell arrays to drive wordlines thereof, first amplification stages each respectively positioned on at least one side of a corresponding one of the cell arrays, wherein the first amplification stages are coupled to bitlines of the respective cell arrays, a first data bus coupled to each of the first amplification stages, a second amplification stage coupled to the first data bus, a second data bus coupled to the second amplification stage, and a third amplification stage coupled to the second data bus.

To achieve at least the above objects and other advantages in a whole or in part and in accordance with the purpose of the present invention, as embodied and broadly described, It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
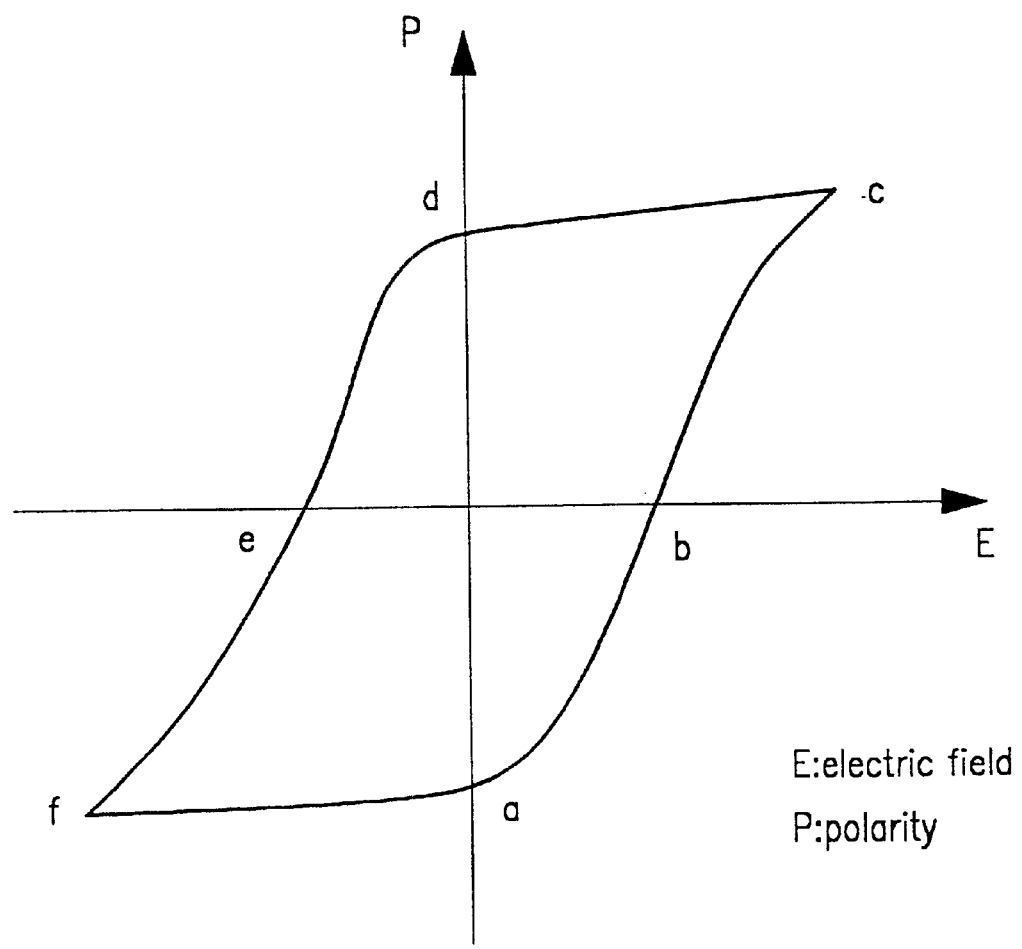
FIG. 1 shows a hysteresis loop of a ferroelectric.
Figure 2:
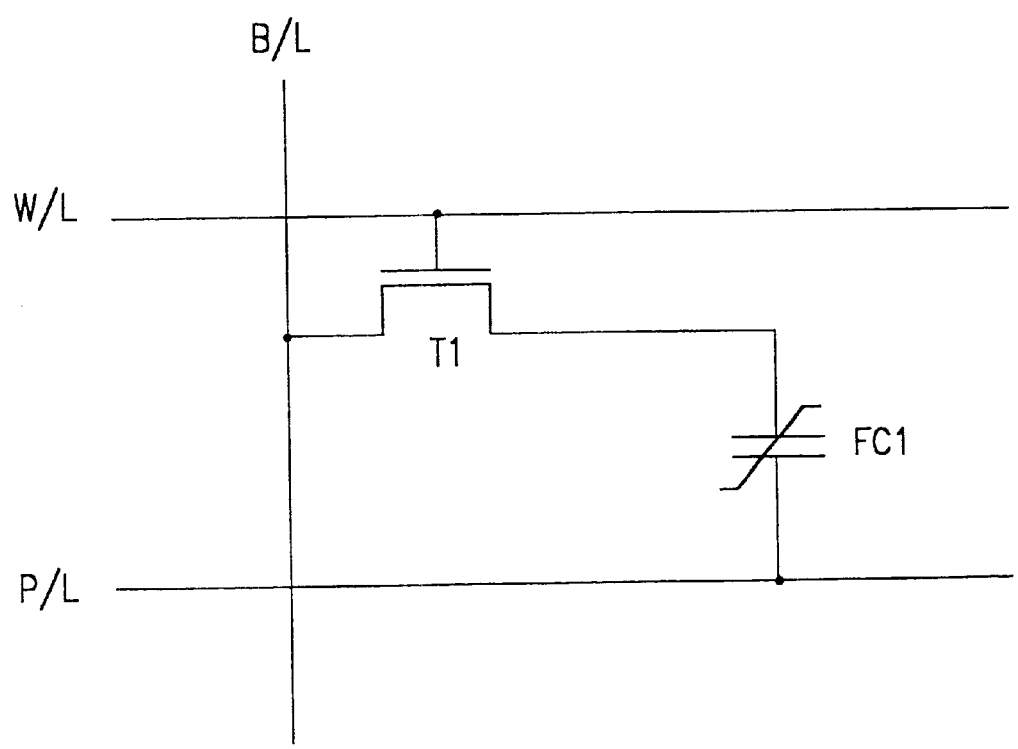
FIG. 2 is a schematic diagram of a unit cell of a related art nonvolatile ferroelectric memory.
Figure 3A:
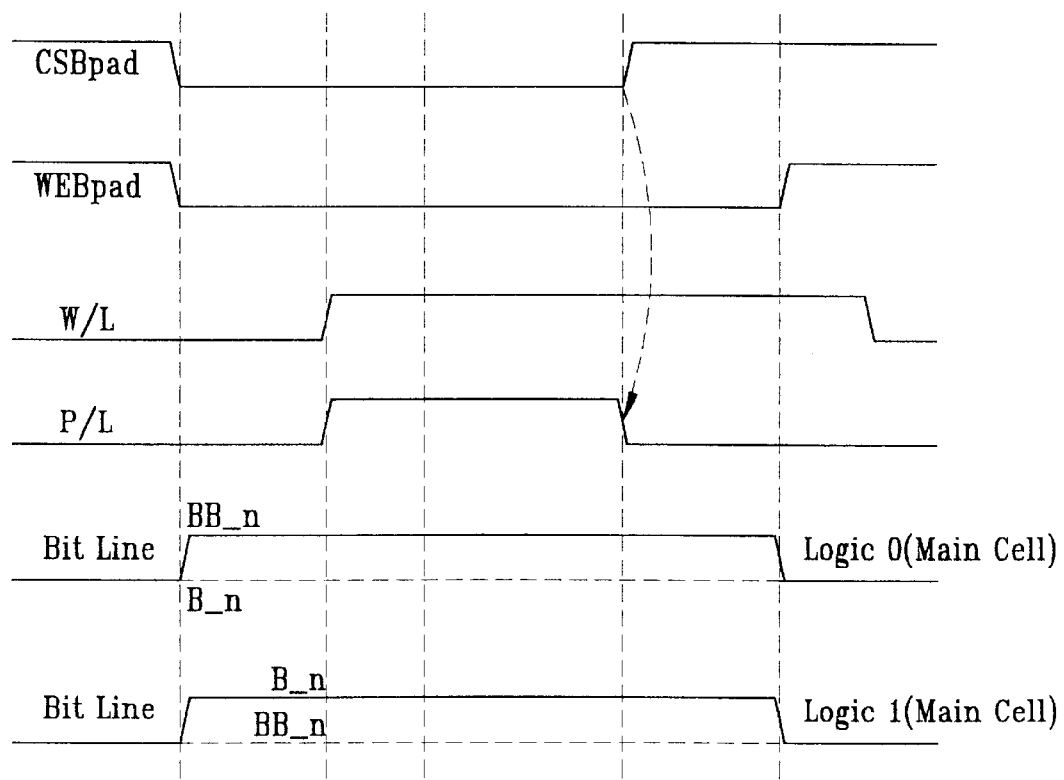
FIG. 3a is a timing chart illustrating the operation of a write mode of the related art nonvolatile ferroelectric memory device.
Figure 3B:
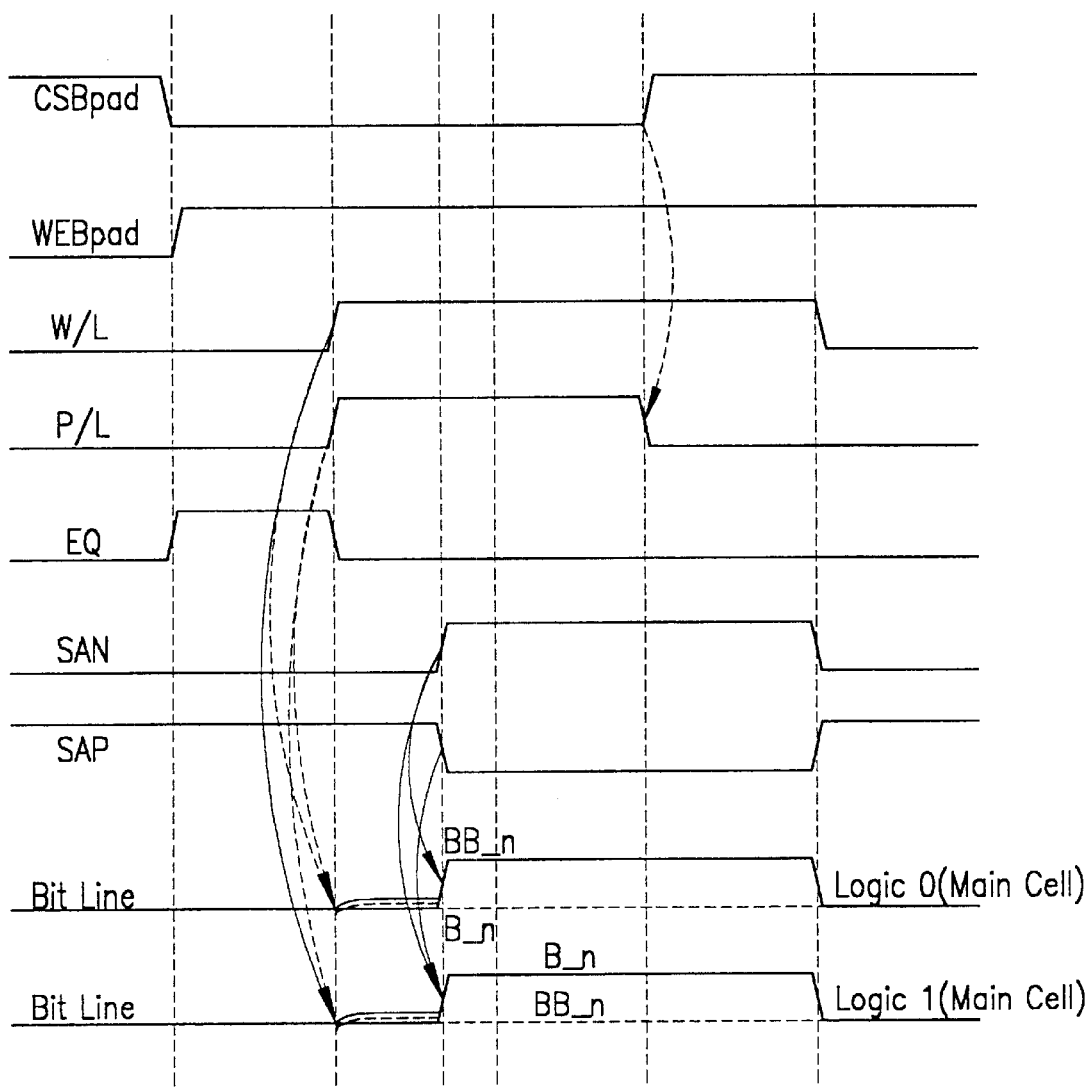
FIG. 3b is a timing chart illustrating the operation of a read mode of the related art nonvolatile ferroelectric memory device.
Figure 4:
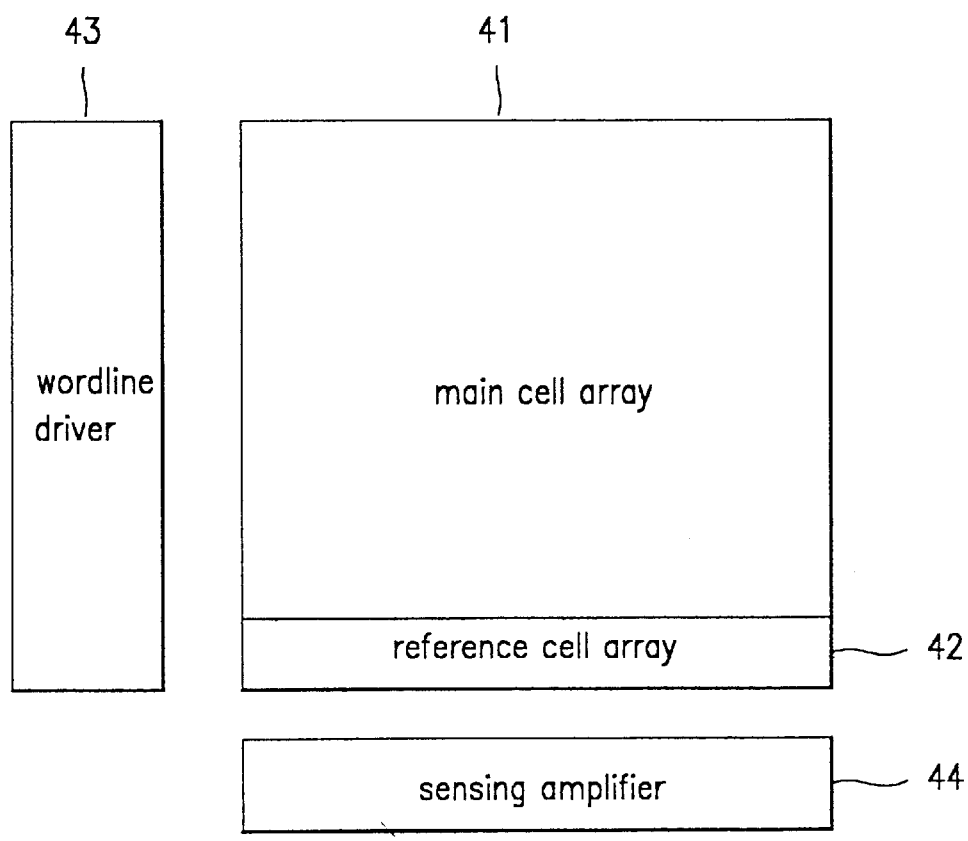
FIG. 4 is a block diagram of the related art nonvolatile ferroelectric memory device.
Figure 5:
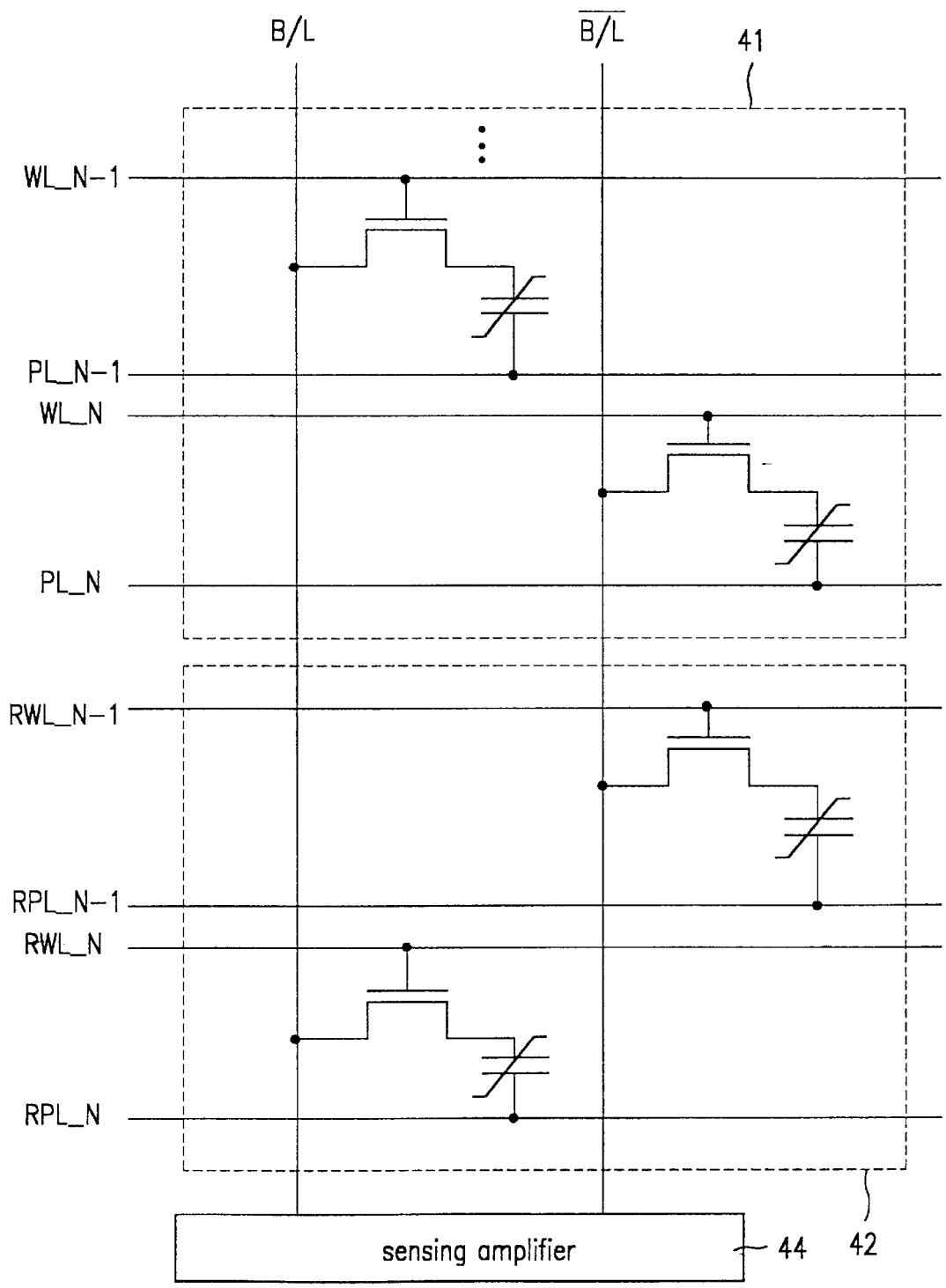
FIG. 5 is a diagram of a partially detailed view of FIG. 4.
Figure 6:
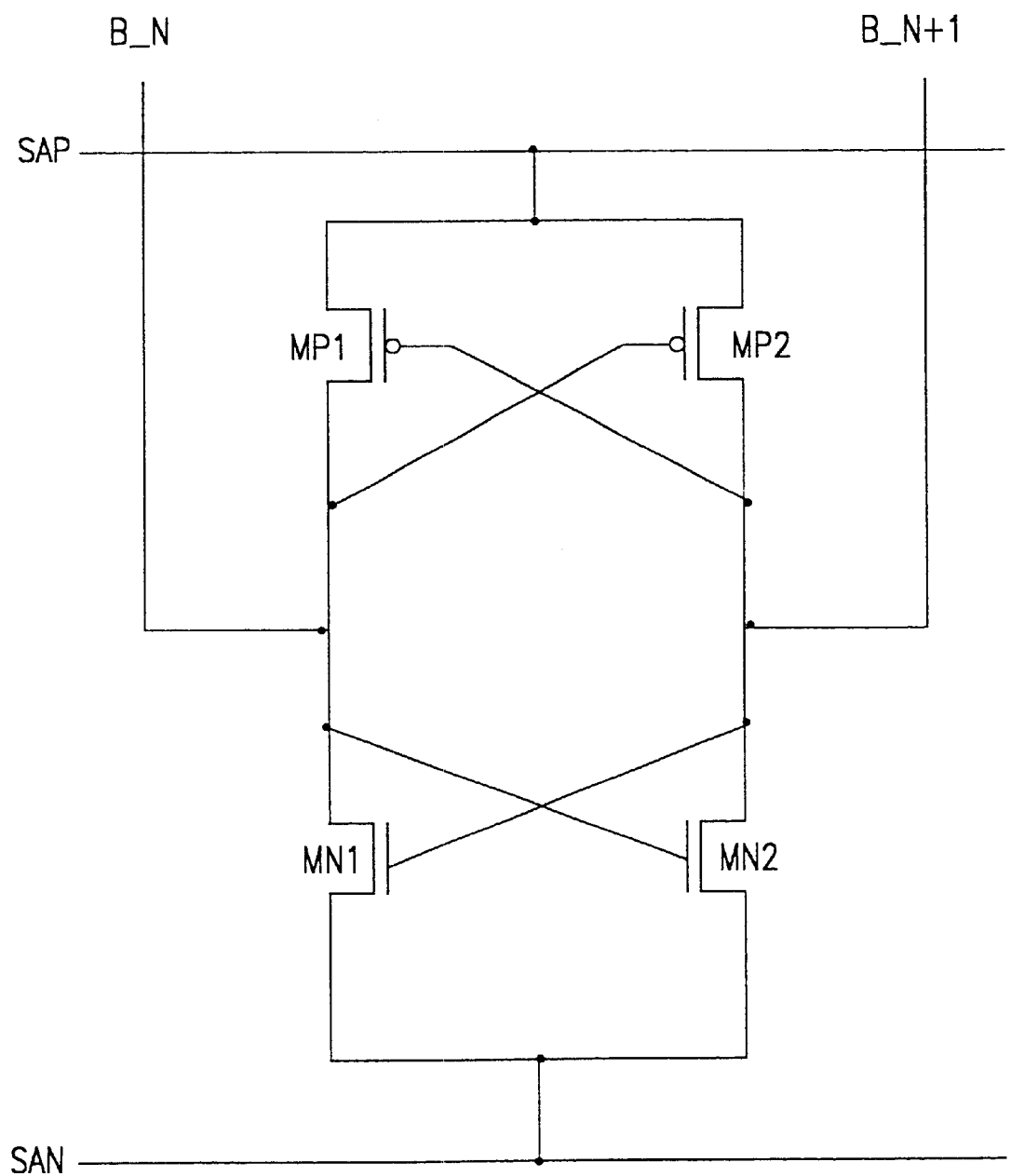
FIG. 6 is a schematic diagram of a sensing amplifier according to the related art nonvolatile ferroelectric memory device.
Figure 7:
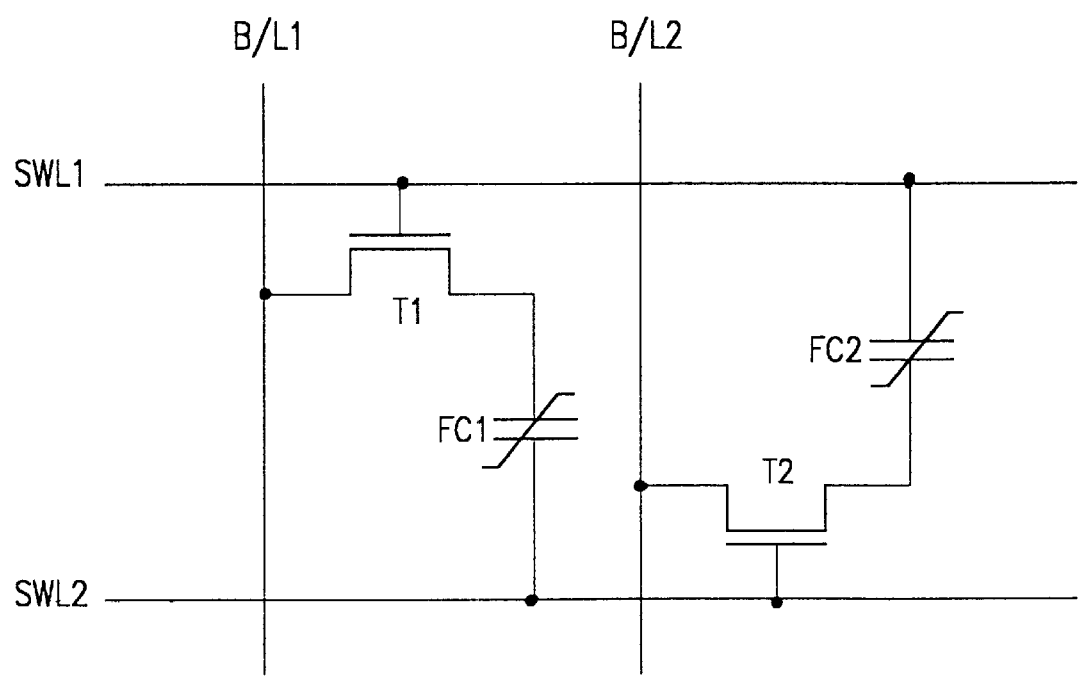
FIG. 7 is a schematic diagram showing a unit cell of a nonvolatile ferroelectric memory device according to preferred embodiments of the present invention.

FIG. 7 is a schematic view showing a unit cell of a nonvolatile ferroelectric memory device according to preferred embodiments of the present invention. As shown in FIG. 7, a unit cell of the nonvolatile ferroelectric memory device includes first and second split wordlines SWL1 and SWL2 formed with a prescribed interval in a row direction, and first and second bitlines B/L1 and B/L2 formed across the first and second split wordlines SWL1 and SWL2. A first transistor TI has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B2, and a second ferroelectric capacitor FC2 is coupled between a source of the second transistor T2 and the first split wordline SWL1. A plurality of the unit cells constitute a cell array.

In view of data storage, the unit cell can include a pair of split wordlines, a bitline, a transistor 1T, and a ferroelectric capacitor 1C. The unit cell can also include a pair of split wordlines, two bitlines, two transistors 2T, and two ferroelectric capacitors 2C. In the preferred embodiments according to the present invention, the unit cell of 2T/2C structure is used.

Figure 8:
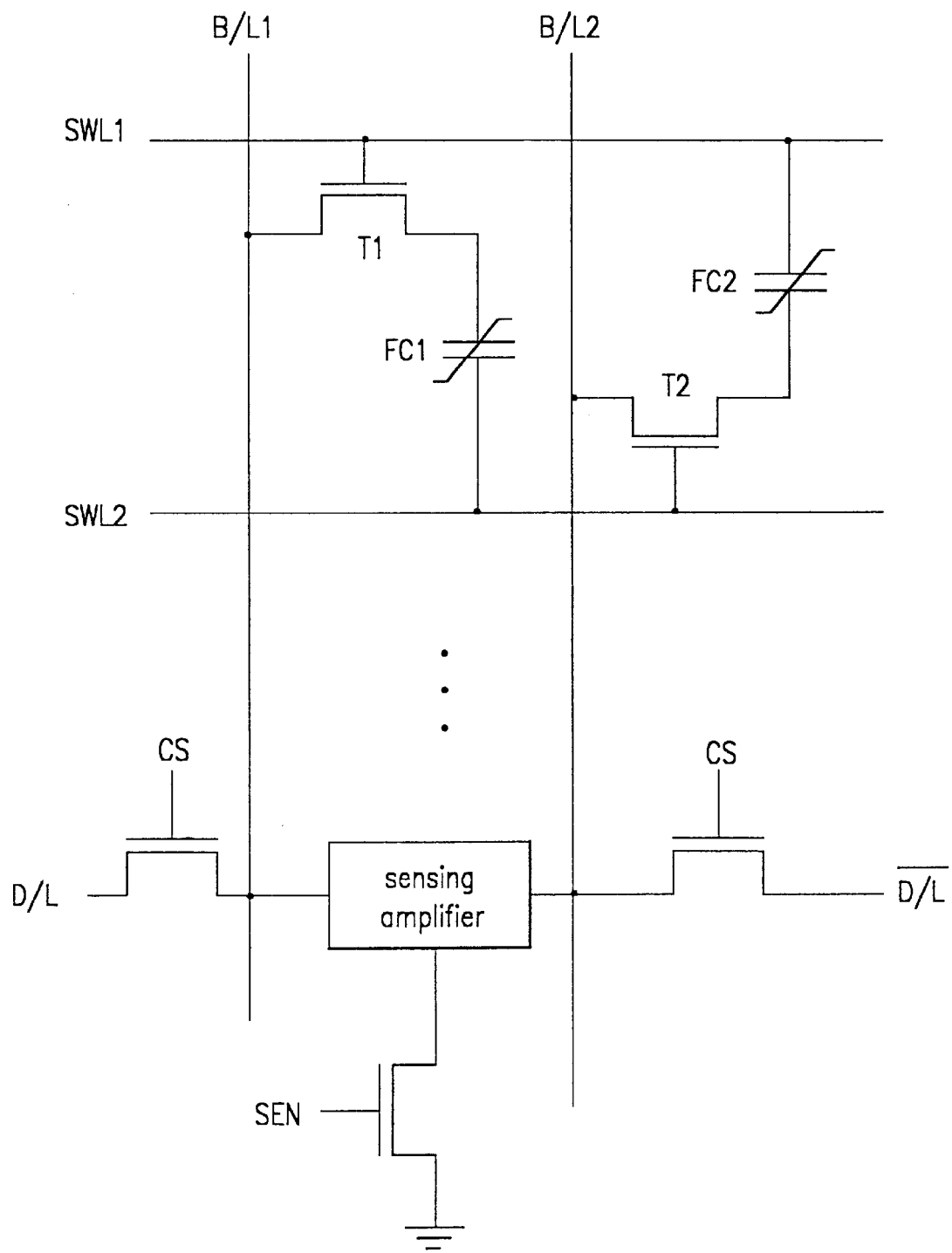
FIG. 8 is a circuit diagram showing a nonvolatile ferroelectric memory device according to preferred embodiments of the present invention.

Operations of the nonvolatile ferroelectric memory device will now be described. FIG. 8 is a circuit diagram showing the nonvolatile ferroelectric memory device according to preferred embodiments of the present invention.

As shown in FIG. 8, a plurality of split wordline pairs including first and second split wordlines SWL1 and SWL2 in pairs are preferably formed in row direction. A plurality of bitlines B/Ln and B/Ln+1 are formed across the split wordline pairs. Sensing amplifiers SA are formed between the respective bitlines to sense data transmitted through the bitlines and transfer the sensed data to a data line DL or a data bar line /DL. At this time, a sensing amplifier enable portion and a selection switching portion are provided. The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 9.

Figure 9:
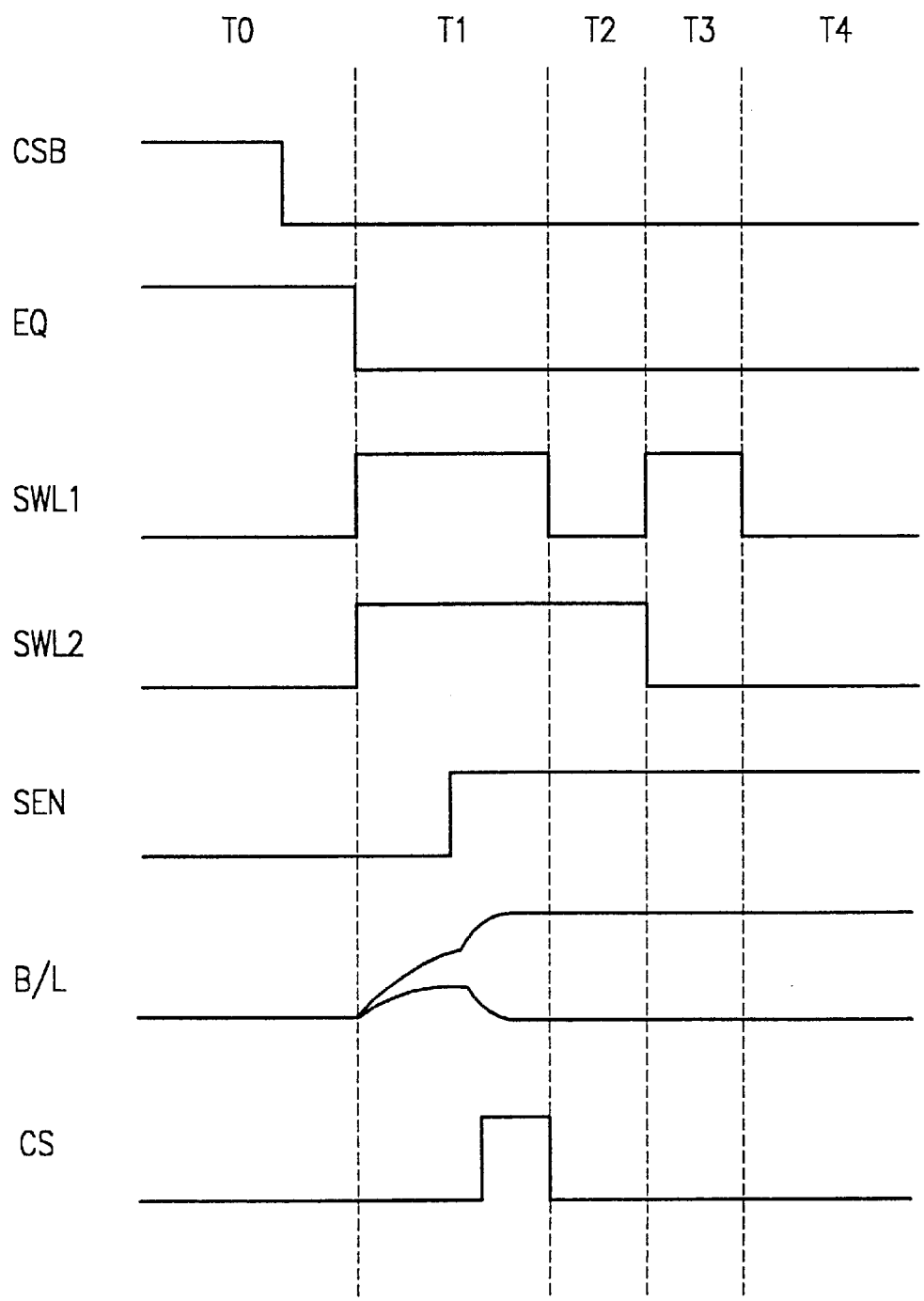
FIG. 9 is a timing chart showing operations of a nonvolatile ferroelectric memory device according to preferred embodiments of the present invention.

A T0 period in FIG. 9 denotes a period before the first split wordline SWL1 and the second split wordline SWL2 are activated to "high(H)". In this T0 period, all of bitlines are preferably precharged at a threshold voltage level of an NMOS transistor.

A T1 period denotes a period that the first and second split wordlines SWL1 and SWL2 are all to become "H". In this T1 period, data of the ferroelectric capacitor in the main cell are transmitted to the main bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 10:
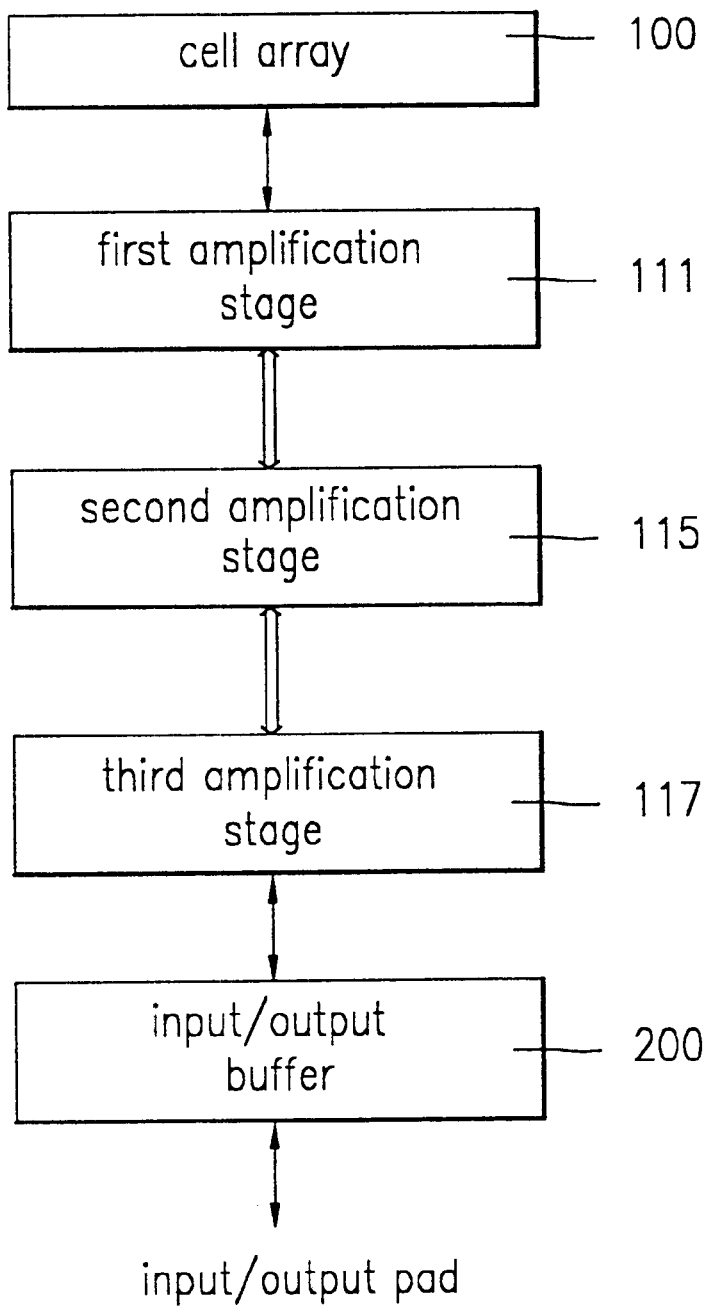
FIG. 10 is a block diagram showing a preferred embodiment of a sensing amplifier of a nonvolatile ferroelectric memory device according to the present invention.

A sensing amplifier according to preferred embodiments of the nonvolatile ferroelectric memory device will now be described with reference to FIG. 10. FIG. 10 is a block diagram showing a hierarchical structure of a sensing amplifier of a nonvolatile ferroelectric memory device according to a preferred embodiment of the present invention.

As shown in FIG. 10, the sensing amplifier includes a first amplification stage for sensing and amplifying signals of a plurality of bitlines of a cell array 100 and outputting the signals through a first data bus. A second amplification stage 115 amplifies output signals of the first amplification stage 111 and outputs the twice amplified signals through a second data bus. A third amplification stage 117 senses and amplifies signals of the second amplification stage 115.

The first data bus and the second data bus are preferably commonly used for data reading and writing operation. The signals amplified by the third amplification stage 117 are applied to an input/output pad through an input/output buffer 200.

In each of a read mode and a write mode, the data buses are commonly used for data reading and writing operations by using different control signals in the respective amplification steps. The read mode and the write mode amplification operations will now be described.

In read mode operations, data of the cell array 100 is primarily amplified by the first amplification stage 111. The first amplification stage 111 includes arrays of sensing amplifiers coupled per main bitline of the cell array 100.

Output signals of the first amplification stage 111 (e.g., output signals of the sensing amplifiers) are transmitted to the second amplification stage 115 through the first data bus (e.g., 112), which is preferably a common output bus.

The second amplification stage 115 secondarily amplifies signals transmitted through the first data bus. Output signals of the second amplification stage 115 are transmitted to the second data bus (e.g., 114), which is an output bus.

The third amplification stage 117 amplifies signals transmitted through the second data bus for a third time. The thrice amplified signals are applied to the input/output pad through the input/output buffer 200.

In write mode operations, the first amplification stage 111 coupled to the cell array 100 primarily senses cell data regardless of reading and writing operations. In other words, the first amplification stage 111 primarily amplifies data of the cell array 100 preferably in the same manner as the read mode. Subsequently, data to write are input to and amplified by the second amplification stage 115 and the third amplification stage 117.

The output node of the first amplification stage 111 can be coupled with the first data bus by a switching device. When the switching device is turned on, the data amplified by the first amplification stage 111 are changed to the data amplified by the second amplification stage 115. However, the present invention is not intended to be so limited. For example, the switching device can be coupled to other than the first amplification stage.

In other words, data to write in the second amplification stage 115 are exchanged with the cell data of the first amplification stage 111. New data of the first amplification stage 111 are transmitted to the bitline so that the new data can be written in the main cell.

In the above described operations, one data bus is commonly used for reading and writing operations without separately using a data bus for reading operation and a data bus for writing operation according to preferred embodiments of the present invention. A sensing amplifier of the nonvolatile ferroelectric memory device according to a first preferred embodiment of the present invention will now be described.

Figure 11:
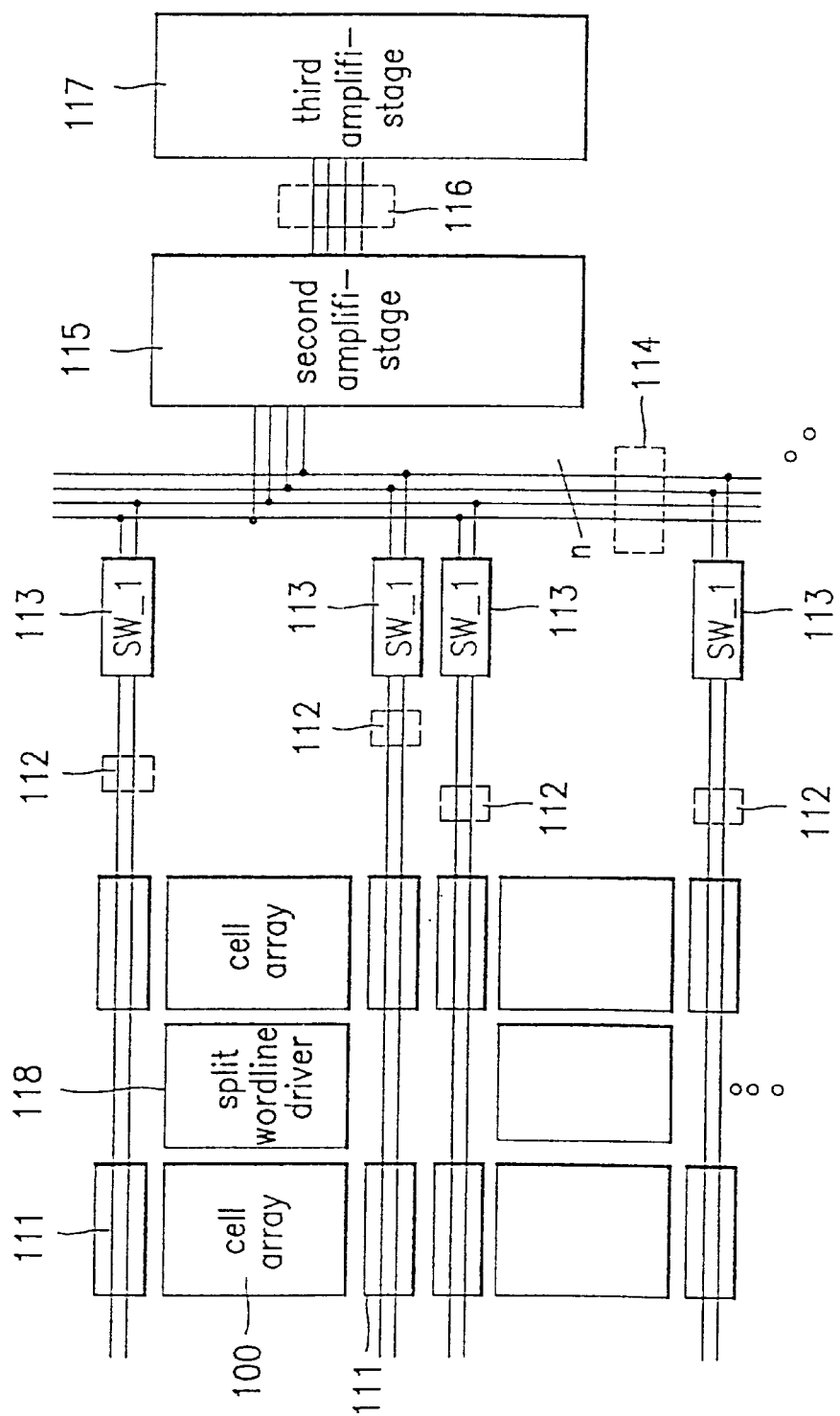
FIG. 11 is a schematic diagram showing a sensing amplifier of a nonvolatile ferroelectric memory device according to another preferred embodiment of the present invention.

As shown in FIG. 11, a sensing amplifier of the nonvolatile ferroelectric memory device according to a first preferred embodiment includes a plurality of cell arrays 100 formed in a matrix arrangement, first amplification stages 111 respectively formed in lower and upper parts of the respective cell arrays 100, and first data buses 112 commonly used for the first amplification stages 111 disposed in a row direction for interfacing output signals of the first amplification stages 111. Switching portions 113 are coupled to output terminals of the first data buses 112, and a second data bus 114 interfaces output signals transmitted through a pair of the switching portions 113. A second amplification stage 115 senses and amplifies signals transmitted through the second data bus 114, a third data bus 116 interfaces the output signals of the second amplification stage 115, and a third amplification stage 117 senses and amplifies signals transmitted through the third data bus 116.

A split wordline driver 118 outputs driving signals to the cell arrays 100. The data buses between the respective amplification stages are used for both data reading and writing operation. Further, it is noted that the data reading and writing operation is performed through the same data bus.

The first amplification stage 111 includes sensing amplifiers coupled per main bitline of the respective cell array 100. The sensing amplifiers commonly use the first data bus 112. The switching portions 113 are selectively turned on/off when the signals loaded into the first data bus 112 are transmitted to the second data bus 114.

The third amplification stage 117 includes sensing amplifiers preferably equal in number to input/output pads. Output signals of the respective sensing amplifiers are applied to the respective input/output pads.

Operations according to the first preferred embodiment of the present invention will now be described. Adjacent lower and upper parts of the respective cell array 100, the first amplification stage 111 is respectively provided. The first amplification stage 111 includes a plurality of sensing amplifiers preferably equal in number to the number of bitlines of the cell array.

The sensing amplifiers of the first amplification stage 111 may be formed in only one of the lower and upper parts. However, in the first preferred embodiment, the one half of the sensing amplifiers are formed in the lower part and the remaining half are formed in the upper part. In other words, if the number of the bitlines is n, a signal of n/2 number of bitlines is amplified by the first amplification stage 111 of the upper part while a signal of the other n/2 number of bitlines is amplified by the first amplification stage 111 of the lower part.

The first amplification stages 111 are respectively formed in the lower and upper parts around the respective cell array. Then, the first data bus 112 is formed in the upper part to be commonly used by the first amplification stages 111 of the upper part, and the first data bus 112 is also formed in the lower part to be commonly used by the first amplification stages of the lower part.

The first data buses 112 formed in the lower and upper parts of the respective cell array 100 are respectively coupled to the switching portions 113. Since the switching portions 113 are also coupled to the first data buses 112 formed in the lower and upper parts around the respective cell array 100, one cell array includes two switching portions 113.

Therefore, if the cell array 100 is formed as much as n in column direction, the respective cell array 100 includes total 2n number of switching portions 113. Only signals that passed through a pair of turned-on switching portions of 2n number of switching portions 113 are transmitted to the second data bus 114.

The second data bus 114 transmits signals that passed through the switching portion 113 to the second amplification stage 115. The second amplification stage 115 senses and amplifies signals transmitted through the second data bus 114 and then outputs the signals to the third data bus 116.

The signals transmitted through the third data bus 116 are sensed and amplified by the third amplification stage 117. At this time, the third amplification stage 117 includes one sensing amplifier for each of the input/output pads.

Figure 12:
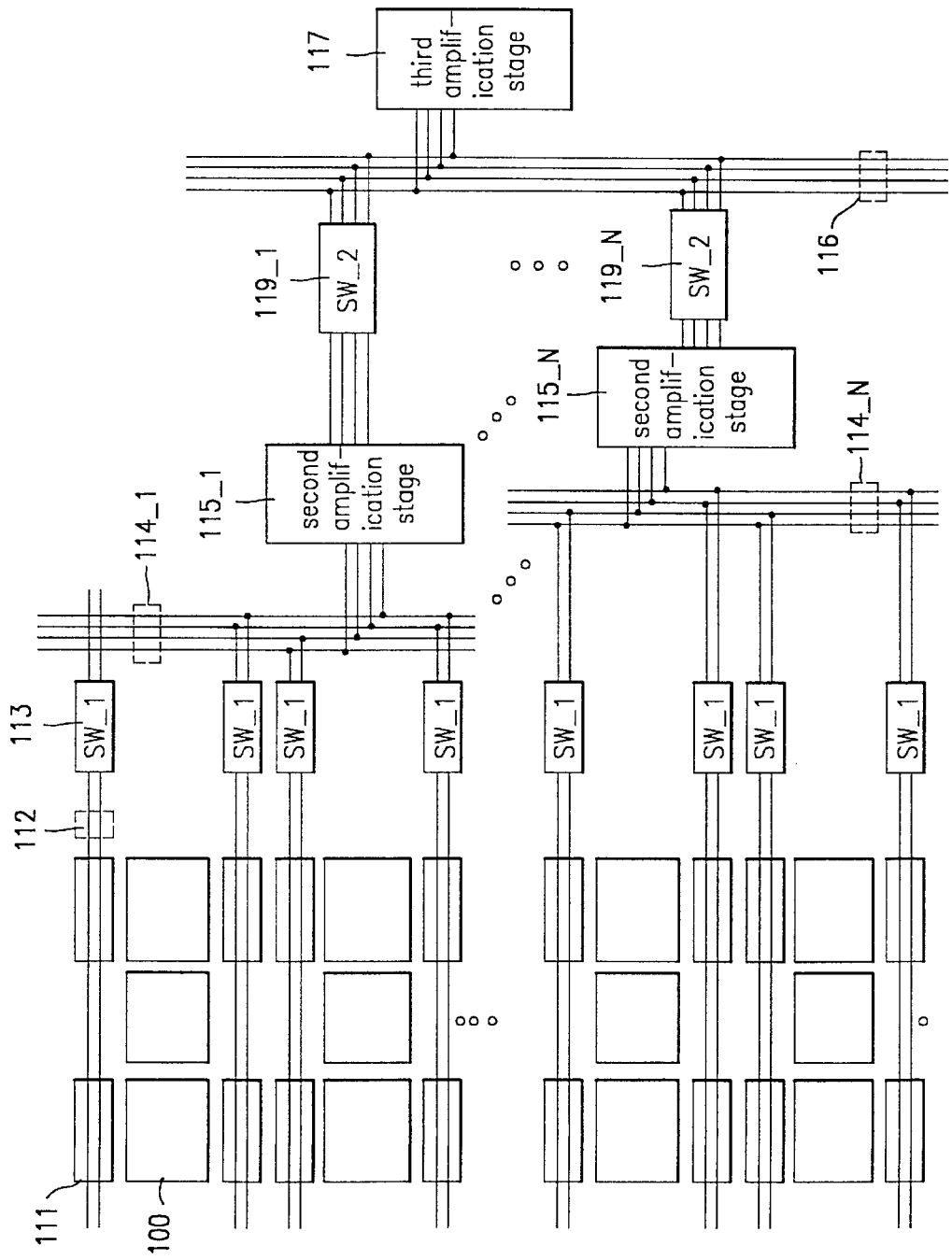
FIG. 12 is a schematic diagram showing a sensing amplifier of a nonvolatile ferroelectric memory device according to another preferred embodiment of the present invention.

FIG. 12 is a diagram that shows a second preferred embodiment of a nonvolatile ferroelectric memory device according to the present invention. In the second preferred embodiment shown in FIG. 12, a plurality of second data buses are provided. As described above, a single second data bus is provided in the first preferred embodiment according to the present invention, while two or more second data buses are provided in the second preferred embodiment of the present invention.

In other words, when a plurality of cell arrays 100 are formed in column direction, the cell arrays 100 are divided into several groups and each group includes a second data bus. Therefore, a plurality of second amplification stages coupled to the second data buses are provided since the plurality of second data buses are provided. A second switching portion is provided at each output side of the second amplification stages. Therefore, the second switching portions are preferably provided equal in number to the second amplification stages. Signals that passed through turned-on switching portions of the second switching portions are interfaced with the third amplification stage by the third data bus.

As shown in FIG. 12, the second preferred embodiment includes a plurality of cell arrays 100 in a matrix arrangement, first amplification stages 111 respectively formed in lower and upper parts of the respective cell arrays 100, and first data buses 112 commonly used for reading and writing of data and coupled to the first amplification stages 111 are disposed on the same plane in a row direction. First switching portions 113 are coupled with the respective first data buses 112, and second data buses 114_1, 114_2, . . . ,114_N are commonly used for reading and writing of data and for interfacing any signals from a plurality of output groups divided by the first switching portions 113. Second amplification stages 115_1,115_2, . . . ,115_N are for amplifying signals transmitted through the respective second data buses 114_1,114_2, . . . ,114_N. Second switching portions 119_1,119_2, . . . ,119_N are for switching signals output from the respective second amplification stages 115_1,115_2,. . . ,115_N. A third data bus 116 is commonly used for reading and writing of the data and for interfacing signals output from any one of the second switching portions 119_1,119_2, . . . ,119_N, and a third amplification stage 117 is for sensing and amplifying signals transmitted through the third data bus 116.

Output signals of the third amplification stage 117 are applied to input/output pads. The third amplification stage 117 preferably includes sensing amplifiers equal in number to the input/output pads.

Operations according to the second preferred embodiment of the present invention will now be described. Signals of the bitlines are amplified by the first amplification stages 111 and transmitted to the first data buses 112. Preferably, operations of transmitting the signals to the second data buses 114 through the first switching portions 113 is the same as that of the first preferred embodiment.

Therefore, in the second preferred embodiment of the present invention, operations of transmitting the signals from the second amplification stages 115_1,115_2, . . . ,115_N to the third data bus 116 and the third amplification stage 117 will now be described.

As shown in FIG. 12, the plurality of second data buses 114_1,114_2, . . . ,114_N are formed and respectively coupled with the second amplification stages 115_1,115_2, . . . ,115_N. The respective second amplification stages 115_1,115_2, . . . , , 115_N sense and amplify signals transmitted through the second data buses 114_1,114_2, . . . ,114_N coupled thereto.

It is determined by the second switching portions 119_1,119_2, . . . ,119_N whether or not the signals amplified by the respective second amplification stages 115_1,115_2, . . . ,115_N are transmitted to the third data bus 116. Since the second switching portions 119_1, . . . ,119_N are respectively coupled to the second amplification stages 115_1, . . . ,115_N, it is determined that data of which one of the cell arrays 100 are transmitted to the third data bus 116 depending on which one of the second switching portions 119_1, . . . ,119_N is turned on.

Therefore, the signals that passed through the turned-on switching portions of the second switching portions 119_1, . . . ,119_N are transmitted to the third data bus 116. Then, the third data bus 116 transmits the signals to the third amplification stage 117.

Subsequently, the third amplification stage 117 senses and amplifies the signals transmitted through the third data bus 116 and outputs the resultant value to the input/output pads. In the second preferred embodiment, if one of the first data buses is of n/2 bit, one of the second data buses is of n bit.

Figure 13:
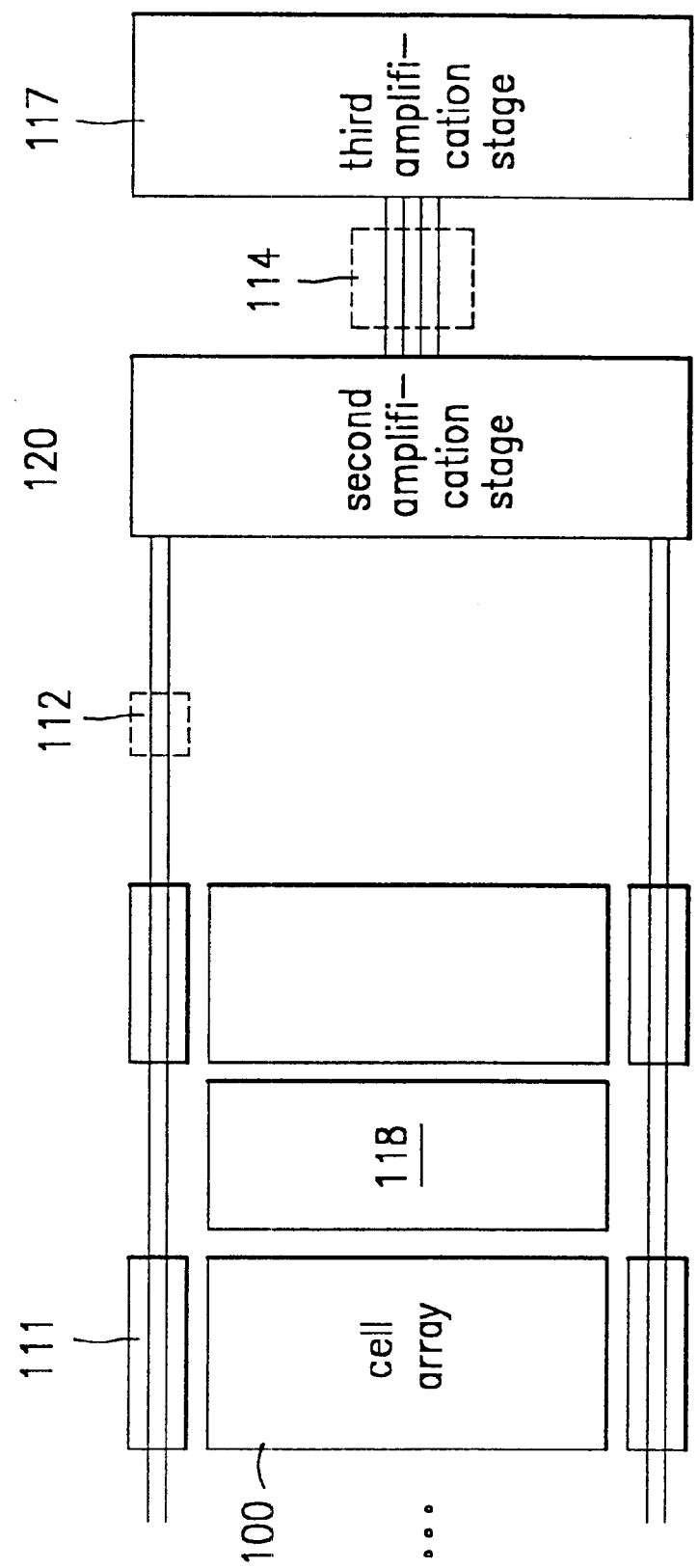
FIG. 13 is a schematic diagram showing of a sensing amplifier of a nonvolatile ferroelectric memory device according to another preferred embodiment of the present invention.

FIG. 13 is a diagram that shows a third preferred embodiment of a nonvolatile ferroelectric memory device according to the present invention. In the third preferred embodiment according to the present invention, a plurality of cell arrays are formed only in row direction. In other words, in case of a memory which does not require high packing density, the cell arrays may be formed in row direction instead of matrix arrangements. In the third preferred embodiment, data reading and writing operation can be performed through the same data bus.

In the first and second preferred embodiments according to the present invention, the switching portions are coupled to the respective first data buses. In the third preferred embodiment according to the present invention, the first data bus 112 is directly coupled with a second amplification stage 120.

When the cell arrays are repeatedly formed in column direction, a switching portion is required to select any one of the cell arrays. However, when the cell arrays are formed in the manner of the third preferred embodiment of the present invention, a switching portion is not required.

As shown in FIG. 13, the first data bus 112 is directly coupled to the second amplification stage 120 so that the signals transmitted through the first data bus 112 of the upper part and the first data bus 112 of the lower part are amplified by the second amplification stage 120 and then transmitted to the second data bus 114. Then, the second data bus 114 transmits the signals to the third amplification stage 117.

Figure 14:
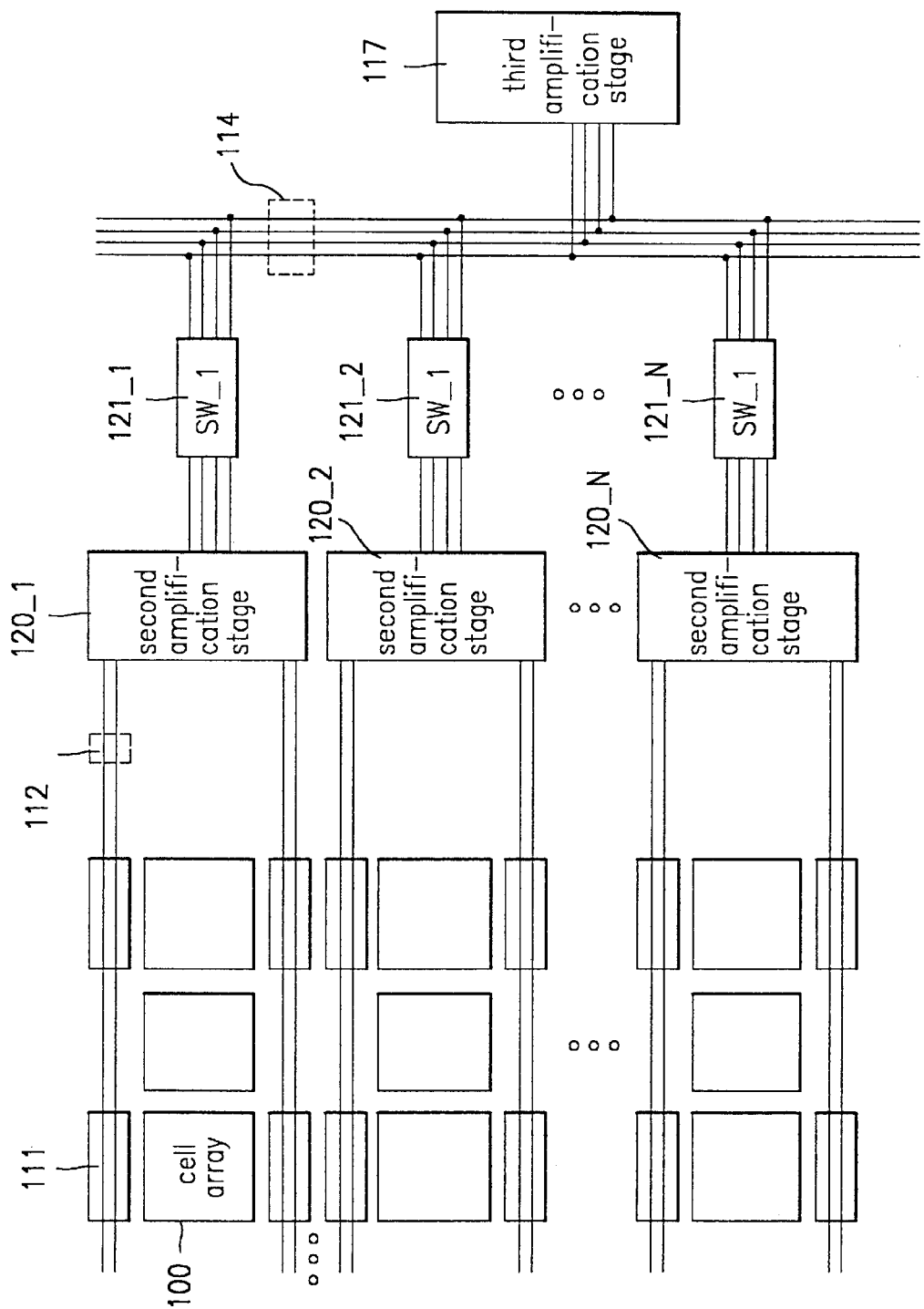
FIG. 14 is a schematic diagram showing a sensing amplifier of a nonvolatile ferroelectric memory device according to still another preferred embodiment of the present invention.

FIG. 14 is a diagram that shows a fourth preferred embodiment of a nonvolatile ferroelectric memory device according to the present invention. In the fourth preferred embodiment according to the present invention, the cell arrays are formed in matrix arrangement but switching portions are not formed between a first data bus and a second amplification stage. In the fourth preferred embodiment according to the present invention, the switching portions are formed in output terminals of the second amplification stages 120_1,120_2, . . . ,120_N.

In the fourth preferred embodiment according to the present invention, the second amplification stages 120_1, 120_2, . . . , 120_N are formed equal in number to the cell arrays, which are formed in column direction. The switching portions 121_1,121_2, . . . ,121_N are formed between the second amplification stages 120_1, 120_2, . . . ,120_N and the second data bus 114. In other words, the second amplification stages 120_1, 120_2, . . . 120_N are formed, and the switching portions 121_1,121_2, . . . ,121_N are coupled to the respective second amplification stages.

The outputs of the switching portions 121_1, 121_2, . . . , 121_N are coupled to the second data bus 114 and then signals that passed through any of the turned-on/off switching portions 121_1,121_2, . . . ,121_N are only transmitted to the second data bus 114. The third amplification stage 117 amplifies the signals transmitted through the second data bus 114 and applies them to the input/output pads.

In the sensing amplifier according to the fourth preferred embodiment according to the present invention, in sensing data of the memory cell and finally applying them to the input/output pads, three-stage amplification is performed and data reading and writing operation is performed through the same data bus by controlling control signals applied to the respective amplification stages.

Figure 15:
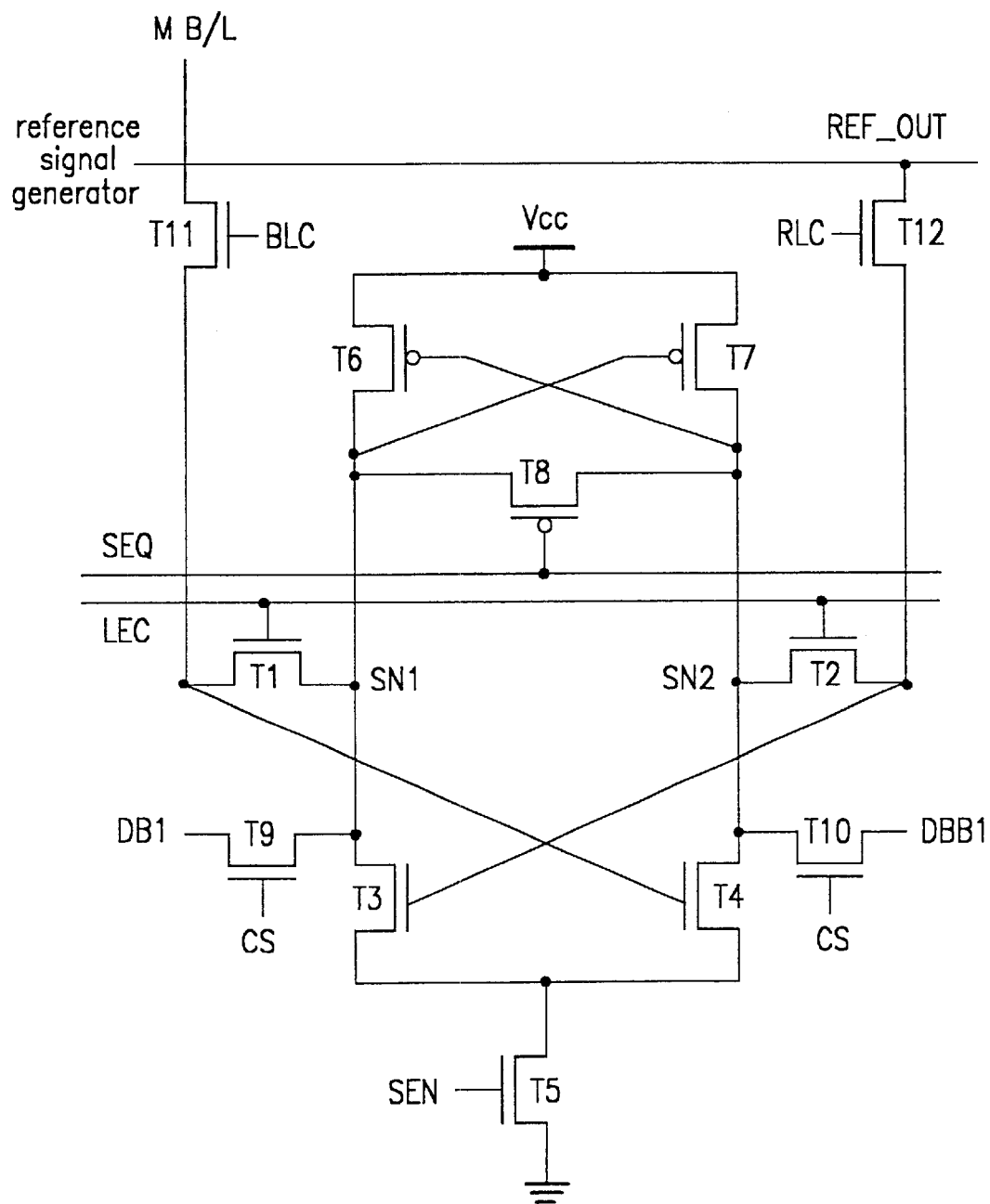
FIG. 15 is a diagram showing a preferred embodiment of a first amplification stage of a sensing amplifier of a nonvolatile ferroelectric memory device according to the present invention.

FIG. 15 is a diagram showing additional detail of a first preferred embodiment of a first amplification stage of the sensing amplifier of the nonvolatile ferroelectric memory device according to the present invention. As shown in FIG. 15, the first amplification stage of the sensing amplifier includes a first transistor T1 for switching a signal of the main bitline that is applied to its source, a second transistor T2 for switching a reference signal applied to its source, and a third transistor T3 whose gate is coupled with the source of the second transistor T2 and whose drain is coupled with a drain of the first transistor T1. A fourth transistor T4 has a gate coupled with an input terminal of the first transistor T1 and whose drain is coupled with the drain of the second transistor T2. A fifth transistor T5 has a source coupled with a ground terminal and a drain commonly coupled to the third and fourth transistors. A sixth transistor T6 has a gate coupled with the drain of the second transistor T2, a source coupled with a power source voltage terminal Vcc and a drain coupled with the drain of the first transistor T1. A seventh transistor T7 has a gate coupled with the drain of the first transistor T1, a source coupled with the power source voltage terminal, and a drain coupled with the drain of the second transistor T2, and an eighth transistor T8 equalizes the drain of the sixth transistor T6 with the drain of the seventh transistor T7. A ninth transistor T9 has a source coupled with the drain of the third transistor T3 for switching the amplified signal of the main bitline to a data bus DB1, and a tenth transistor has a source coupled with the drain of the fourth transistor T4 for switching a reverse phase signal of the amplified signal of the main bitline to a data bar bus DBB1.

The first amplification stage of the sensing amplifier further includes an eleventh transistor T11 for switching the signal of the main bitline to the source of the first transistor T1 and a twelfth transistor T12 for switching the reference signal to the source of the second transistor T2. The eleventh transistor T11 is controlled by a main bitline control signal BLC while the twelfth transistor T12 is controlled by a reference bitline control signal RLC.

The first transistor Ti further acts to allow the amplified signal feedback to the gate of the fourth transistor T4, and the second transistor T2 further acts to allow the amplified signal feedback to the gate of the third transistor T3.

The first and second transistors T1 and T2 are turned on in case of data writing operation but turned off in case of data reading operation. The ninth and tenth transistors T9 and T10 are controlled by a column selection signal CS.

In the first amplification stage shown in FIG. 15, preferably the sixth, seventh and eighth transistors T6, T7 and T8 constitute PMOS transistors and the remaining transistors constitute NMOS transistors. The fifth transistor T5 is operated by a sensing amplifier active signal SEN and the eighth transistor T8 is operated by a sensing amplifier equalizing signal SEQ. And, a latch enable control signal LEC is applied to the gates of the first and second transistors T1 and T2.

Operations of the preferred embodiment of the first amplification stage will now be described. As shown in FIG. 15, during precharge, the main bitline control signal BLC, the reference bitline control signal RLC, and the latch enable control signal LEC become high while the column selection signal CS, the sensing amplifier active signal SEN and the sensing amplifier equalizing signal SEQ become low.

In a read mode, the sensing amplifier equalizing signal SEQ and the sensing amplifier active signal SEN become high while the main bitline control signal BLC, the reference bitline control signal BLC and the latch enable control signal LEC become low. Accordingly, the main bitline signal is amplified and then output to the second amplification stage through the data bus DB1 and the data bar bus DBB1. At this time, the latch enable control signal LEC is preferably transited to low so that the main bitline is separated from the data bus DB1 and the data bar bus DBB1.

Subsequently, in a write mode, the sensing amplifier equalizing signal SEQ, the column selection signal CS, and the latch enable control signal LEC are set up at high level before the sensing amplifier active signal SEN is changed to high level. Accordingly, the data to be written in the cell are input through the data bus DB1 and the data bar bus DBB1 to be transmitted to the main bitline.

If the data are transmitted to the main bitline, the sensing amplifier active signal SEN is transited to high level while the other signals are maintained. Accordingly, the first amplification stage becomes active to transmit the data for writing to a corresponding cell through the main bitline.

As described above, by properly controlling the control signals applied to the first amplification stage, it is possible to perform both the reading operation for reading data of the cell to be output through the data bus and the data bar bus and the writing operation for storing the data for writing in the corresponding cell through the main bitline.

Figure 16:
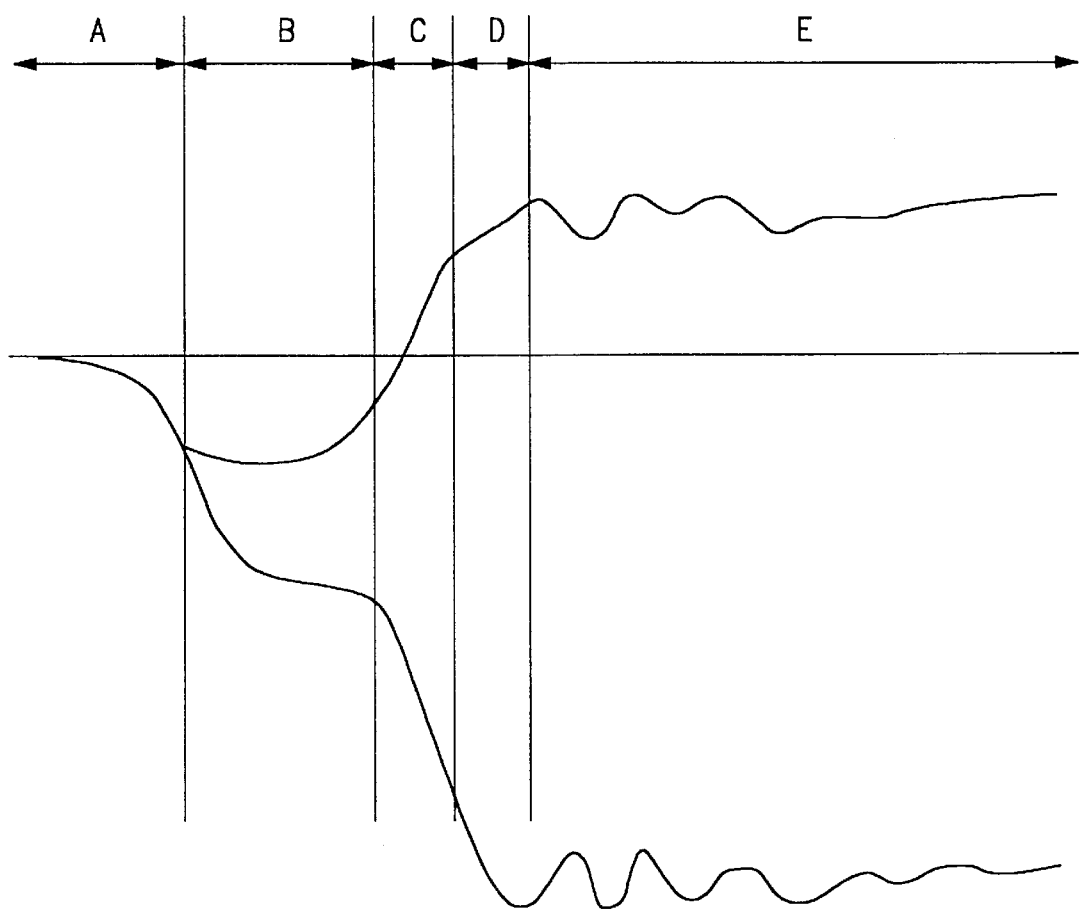
FIG. 16 is a waveform illustrating variation of output waveform of the first amplification stage in a read mode.

FIG. 16 is a diagram that shows output waveforms at nodes SN1 and SN2 in case of the read mode. As shown in FIG. 16, A is a precharge period, B is an amplification period, C is a pseudo latch period, D is an actual latch period, and E is an output period.

Figure 17:
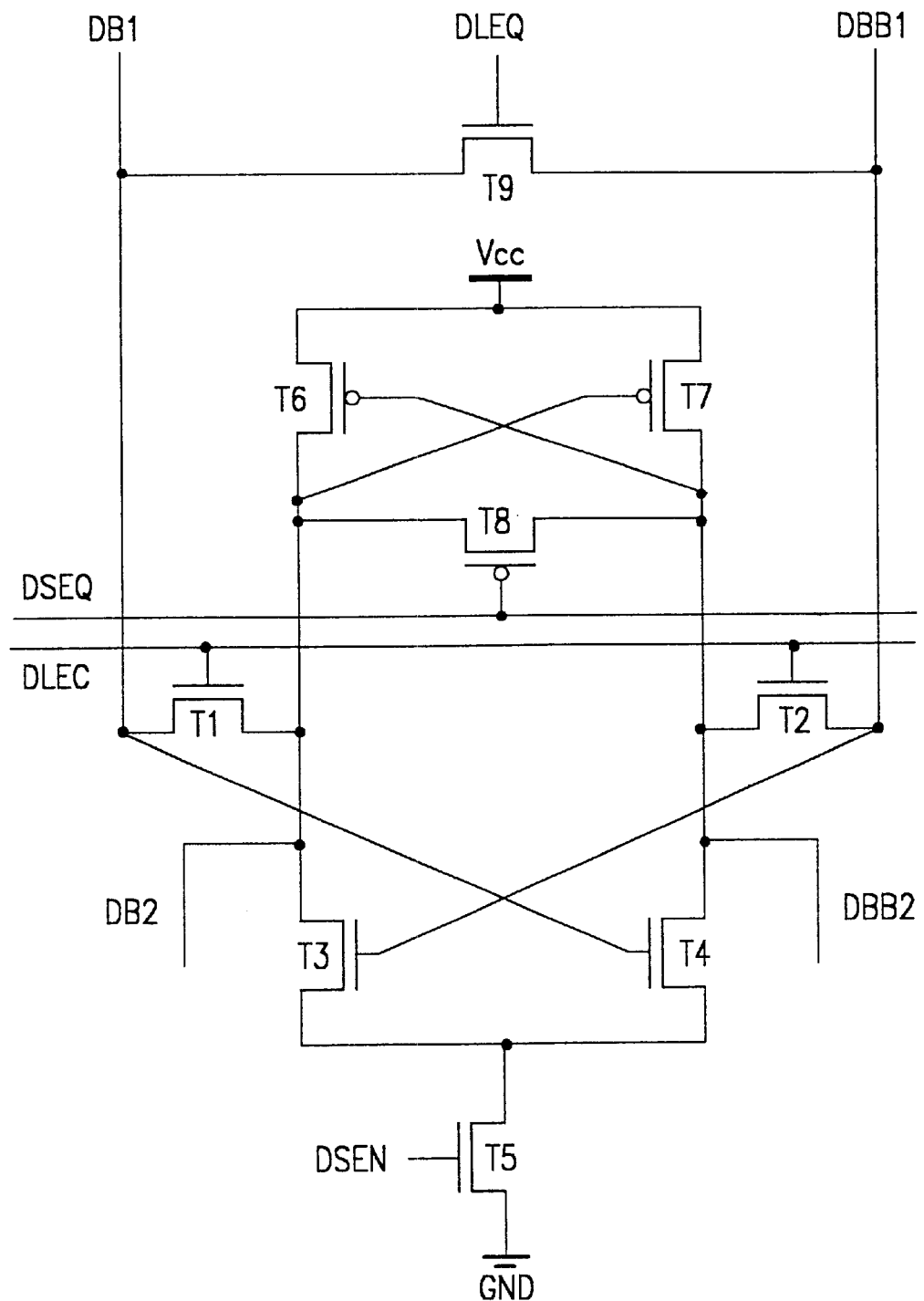
FIG. 17 is a schematic diagram showing a preferred embodiment of a second amplification stage of a sensing amplifier of a nonvolatile ferroelectric memory device according to the present invention.

FIG. 17 is a schematic showing a preferred embodiment of a second amplification stage of the nonvolatile ferroelectric memory device according to preferred embodiments of the present invention. As shown in FIG. 17, in the sensing amplifier for sensing the signal transmitted through the data bus DB1 and the data bar bus DBB1 and applying the sensed signal to another data bus DB2 and data bar bus DBB2, the second amplification stage of the sensing amplifier includes a first transistor T1 for switching a signal of the data bus DB1, which is applied to its source, a second transistor T2 for switching a signal of the data bar bus DBB1, which is applied to its source, a third transistor T3 whose gate is coupled with the source of the second transistor T2 and whose drain is coupled with a drain of the first transistor T1, and a fourth transistor T4 whose gate is coupled with an input terminal of the first transistor T1 and drain is connected with the drain of the second transistor T2.

A fifth transistor T5 has a source coupled with a ground terminal and a drain commonly coupled with the sources of the third and fourth transistors. A sixth transistor T6 has a gate coupled with the drain of the second transistor T2, a source coupled with a power source voltage terminal Vcc and a drain coupled with the drain of the first transistor T1. A seventh transistor T7 has a gate coupled with the drain of the first transistor T1, a source coupled with the power source voltage terminal Vcc and a drain coupled with the drain of the second transistor T2. An eighth transistor T8 equalizes the drain of the sixth transistor T6 with the drain of the seventh transistor T7, and a ninth transistor T9 equalizes the data bus DB1 with the data bar bus DBB1.

The first transistor T1 further acts to allow the amplified signal to be returned back to the gate of the fourth transistor T4, and the second transistor T2 further acts to allow the amplified signal to be returned back to the gate of the third transistor T3. The sixth, seventh and eighth transistors T6, T7 and T8 preferably constitute a PMOS transistor while the other transistors preferably constitute an NMOS transistor.

The ninth transistor T9 is operated by a data bus equalizing signal DLEQ for equalizing the data bus DB1 and the data bar bus DBB1 while the fifth transistor T5 is operated by a sensing amplifier active signal DSEN. The eighth transistor T8 is operated by a sensing amplifier equalizing signal DSEQ, and a latch enable control signal DLEC is applied to the gates of the first and second transistors T1 and T2.

Operations of the preferred embodiment of the second amplification stage will now be described. As shown in FIG. 17, during precharge, the data bus equalizing signal DLEQ for equalizing the data bus DB1 with the data bar bus DBB1 and the latch enable control signal DLEC are high while the sensing amplifier equalizing signal DSEQ and the sensing amplifier active signal DSEN are low. Therefore, the data bus DB1 and the data bar bus DBB1 for interfacing the output of the first amplification stage are precharged to high level.

In a read mode, the sensing amplifier equalizing signal DSEQ and the sensing amplifier signal DSEN are set up at high level while the data bus equalizing signal DLEQ and the latch enable control signal DLEC are set up at low level. In this case, the signals of the data bus DB1 and the data bar bus DBB1 are amplified.

At this time, the latch enable control signal DLEC for interfacing the output of the second amplification stage becomes low so that the data bus DB1 and the data bar bus DBB1 are separated from the data bus DB2 and the data bar bus DBB2.

In the writing mode, before the sensing amplifier active signal DSEN is changed to high level, the sensing amplifier equalizing signal DSEQ and the latch enable control signal DLEC are set up at high level and the data bus equalizing signal DLEQ is set up to low level. Accordingly, the output data to be written in the cell are transmitted to the data bus DB1 and the data bar bus DBB1 through the data bus DB2 and the data bar bus DBB2.

If the data for writing are transmitted to the data bus DB1 and the data bar bus DBB1, the sensing amplifier active signal DSEN is transited to high level while the other signals are maintained. As a result, the second amplification stage becomes active so that the amplified data (e.g., data to be written in the cell) are transmitted to the first amplification stage to write the data through the main bitline.

Figure 18:
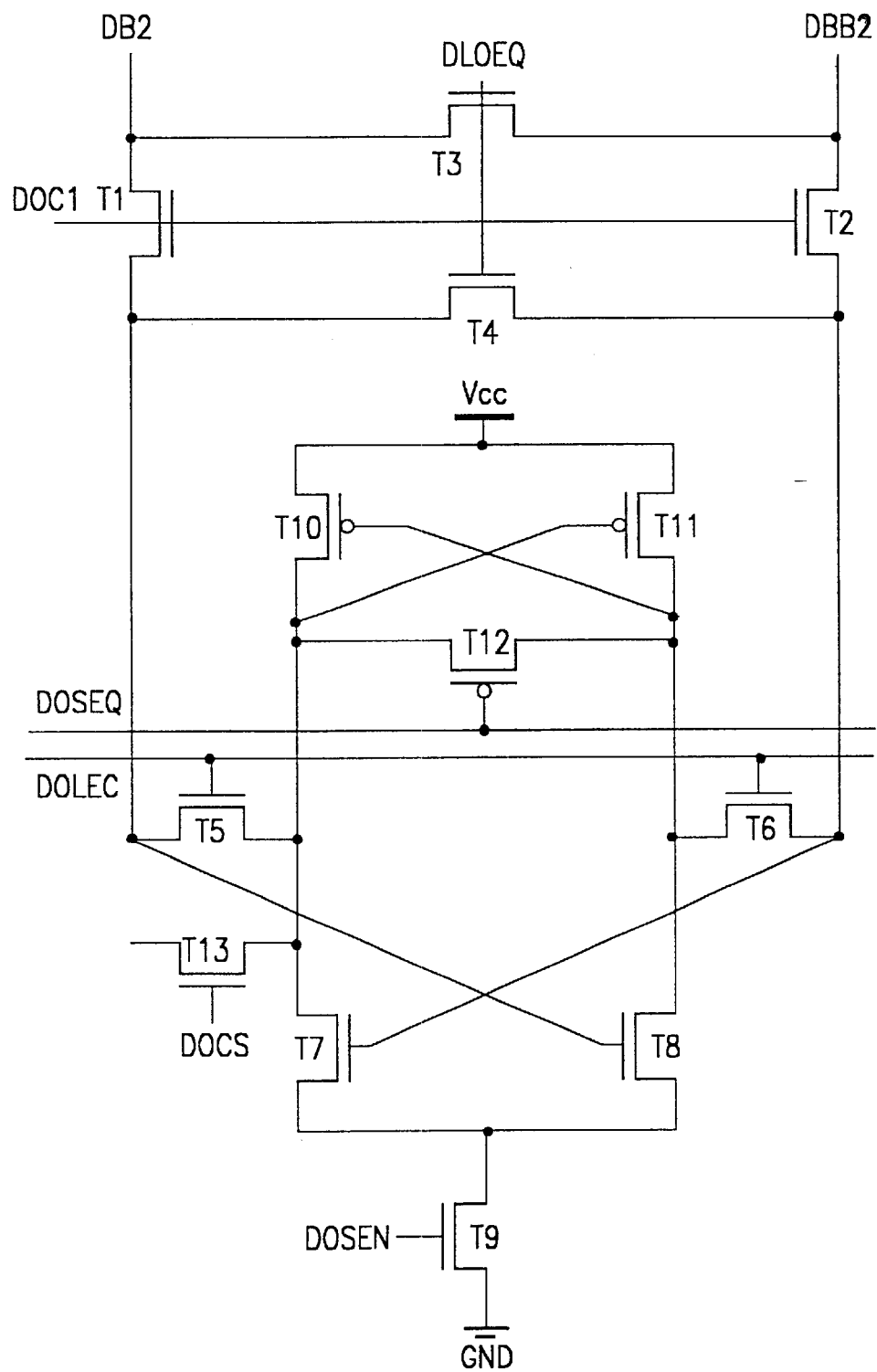
FIG. 18 is a schematic diagram showing a preferred embodiment of a third amplification stage of a sensing amplifier of a nonvolatile ferroelectric memory device according to the present invention.

FIG. 18 is a schematic diagram showing a preferred embodiment of a third amplification stage of the nonvolatile ferroelectric memory device according to the present invention. As shown in FIG. 18, the third amplification stage amplifies the signal transmitted through the data bus DB2 and the data bar bus DBB2 and transmits the amplified signal to the input/output pad.

The third amplification stage includes a first transistor T1 for switching the signal transmitted through the data bus DB2, a second transistor T2 for switching the signal transmitted through the data bar bus DBB2, a third transistor T3 for equalizing a source of the first transistor T1 with a source of the second transistor T2, a fourth transistor T4 for equalizing a drain of the first transistor T1 with a drain of the second transistor T2, a fifth transistor T5 for switching a signal of the data bus DB2, which is applied to its source, and a sixth transistor T6 for switching a signal of the data bar bus DBB2, which is applied to its source. A seventh transistor T7 has a gate coupled with the source of the sixth transistor T6 and a drain coupled with a drain of the fifth transistor T5. An eighth transistor T8 has a gate coupled with an input terminal of the fifth transistor T5 and a drain coupled with the drain of the sixth transistor T6. A ninth transistor T9 has a source coupled with a ground terminal and a drain commonly coupled with sources of the seventh and eighth transistors T7 and T8, and a tenth transistor T10 has a gate coupled with the drain of the sixth transistor T6, a source coupled with a power source voltage terminal and a drain coupled with the drain of the fifth transistor T5. An eleventh transistor T11 has a gate coupled with the drain of the fifth transistor T5, a source coupled with the power source voltage terminal, and a drain coupled with the drain of the sixth transistor T6. A twelfth transistor T12 equalizes the drain of the tenth transistor T10 with the drain of the eleventh transistor T11, and a thirteenth transistor T13 switches the amplified signal to the input/output pad.

The third transistor T3 and the fourth transistor T4 are controlled by a data bus equalizing signal DLOEQ for equalizing the data bus DB2 and the data bar bus DBB2. The fifth transistor T5 further acts to allow the amplified signal to be fed back to the gate of the sixth transistor T6, and the sixth transistor T6 further acts to allow the amplified signal to be fed back to the gate of the fifth transistor T5. The ninth transistor T9 is operated by a sensing amplifier active signal DOSEN while the twelfth transistor T12 is operated by a sensing amplifier equalizing signal DOSEQ. A latch enable control signal DOLEC is applied to the gates of the fifth and sixth transistors T5 and T6.

The first, second, third and fourth transistors T1, T2, T3 and T4 switch the data of the data bus and the data bar bus and at the same time equalize these buses. Each of the switching portions described in the preferred embodiments of the amplification stages preferably include a first transistor for switching the signal of the data bus, a second transistor for switching the signal of the data bar bus, a third transistor for equalizing input terminals of the first and second transistors, and a fourth transistor for equalizing output terminals of the first and second transistors.

Operations of the preferred embodiment of the third amplification stage will now be described. As shown in FIG. 18, during precharge, the data bus DB2 and the data bar bus DBB2 are precharged to high level. At this time, the control signal DOC1 applied to the gates of the first and second transistors T1 and T2 and the control signal DLOEQ applied to the third and fourth transistors T3 and T4 are high while the sensing amplifier active signal DOSEN, the sensing amplifier equalizing signal DOSEQ and the latch enable control signal DOLEC are low.

In a read mode, only the control signal DLOEQ applied to the gates of the third and fourth transistors T3 and T4 becomes low while the other signals DOC1, DOSEN, DOSEQ and a control signal DOCS applied to the gate of the thirteenth transistor T13 are set up at high level so that the signals of the data bus DB2 and the data bar bus DBB2 are amplified and then applied to the input/output pad preferably through the input/output buffer.

In a write mode, before the sensing amplifier active signal DOSEN is changed to high level, the control signals are controlled so that the signals from the input/output buffer (e.g., data for writing) are transmitted to the data bus DB2 and the data bar bus DBB2 of the third amplification stage. If the data for writing are transmitted to the data bus DB2 and the data bar bus DBB2, the sensing amplifier active signal DOSEN is transited to high level at the state that the other signals are maintained as they are.

As a result, the third amplification stage becomes active so that the amplified signals are transmitted to the second amplification stage through the data bus DB2 and the data bar bus DBB2. The second amplification stage amplifies the signals transmitted through the data bus DB2 and the data bar bus DBB2 under the control of the control signals and transmits the amplified signals to the first amplification stage through the data bus DB1 and the data bar bus DBB1. Thereafter, the first amplification stage senses the input signals and transmits the sensed signals to the cell through the main bitline. Finally, the writing operation is completed.

As described above, preferred embodiments of a sensing amplifier of the nonvolatile ferroelectric memory device according to the present invention have various advantages. Both the reading and writing operations can be performed using one data bus without a separate reading data bus and a separate writing data bus by properly controlling the control signals applied to the respective amplification stages. This facilitates layout design and reduces load of the data bus.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A sensing amplifier of a nonvolatile ferroelectric memory device, comprising:

a first amplification stage that amplifies signals of a plurality of bitlines;

a first data bus that transfers a first signal to and from the first amplification stage for writing and reading of data, respectively;

a second amplification stage that amplifies the first signal of the first data bus, wherein the second amplification stage amplifies the data for at least two bitline pairs of the plurality of bitlines;

a second data bus that transfers a second signal to and from the second amplification stage for writing and reading of data, respectively; and a third amplification stage that amplifies the second signal of the second data bus.

2. The sensing amplifier of a nonvolatile ferroelectric memory device of claim 1, wherein the first amplification stage includes a plurality of first sensing amplifiers respectively coupled to a single corresponding one of the plurality of bitlines, wherein the nonvolatile ferroelectric memory device has a plurality of cell arrays, and wherein the first amplification stage amplifies signals from at least two cell arrays.

3. The sensing amplifier of a nonvolatile ferroelectric memory device of claim 1, wherein the first amplification stage is respectively positioned at lower and upper opposing sides of a corresponding cell array.

4. The sensing amplifier of a nonvolatile ferroelectric memory device of claim 1, wherein an output signal of the third amplification stage is applied to input/output pads, and wherein the third amplification stage includes a plurality of second sensing amplifiers equal in number to the input/output pads.

5. A memory device, comprising:
    a plurality of cell arrays in a matrix arrangement;
    first amplification stages respectively positioned at lower and upper portions of a corresponding one of the cell arrays;
    first data buses commonly coupled to the first amplification stages disposed on the same row of the plurality of cell arrays, wherein the first data buses transfers signals of the first amplification stages;
    a second amplification stage that amplifies the signals transmitted through more than one of the first amplification stages;
    first switches coupled with one of the first and second amplification stages to switch output signals thereof;
    an additional data bus that transfers the output signals of the second amplification stage; and
    a third amplification stage that amplifies signals of the an additional data bus.

6. The memory device of claim 5, wherein the first switches are respectively coupled to the first data buses, further comprising:
    a second data bus coupled between a pair of the first switches and the second amplification stage, wherein the second data bus transfers switched signals of the first amplification stage.

7. The memory device of claim 6, wherein all pairs of the first switches switch the signals of the first amplification stage to the second data bus.

8. The memory device of claim 6, wherein an output signal of the third amplification stage is transmitted to input/output pads, and wherein the third amplification stage includes sensing amplifiers equal in number to the input/output pads.

9. The sensing amplifier of a nonvolatile ferroelectric memory device of claim 6, wherein the first amplification stages include sensing amplifier arrays coupled to corresponding bitlines of the cell arrays to sense and amplify data signals for the corresponding bitlines.

10. The memory device of claim 5, wherein the first switches are respectively coupled to the first data buses, further comprising:
    second data buses coupled between the first switches and the second amplification stage, wherein each of the second data buses transfer signals of a corresponding one of a plurality of groups divided from the first switches;
    a plurality of second amplification units each coupled to one of the second data buses that comprise the second amplification stage, wherein each of the plurality of second amplification units amplify signals of a corresponding one of the second data buses;
    second switches that each switch output signals of a corresponding one of the second amplification units, and wherein the additional data bus commonly transfers the switched output signals of any one of the second amplification units.

11. The sensing amplifier of a nonvolatile ferroelectric memory device of claim 5, wherein the second amplification stage includes a plurality of second amplification units each coupled to a corresponding pair of the first data buses, and wherein the first switches are coupled between the second amplification units and the additional data bus.

12. The memory device of claim 5, wherein each of the cell arrays is a nonferroelectric cell array.

13. The memory device of claim 5, wherein a cell in a cell array comprises:
    a first and a second split wordlines extending along one direction at first intervals;
    a first and a second bitlines extending along a second direction to cross the first and second split wordlines at second intervals;
    a first transistor having a second electrode coupled to the first bitline and a control electrode coupled to the first split wordline;
    a first ferroelectric capacitor between a first electrode of the first transistor and the second split wordline;
    a second transistor having a second electrode coupled to the second bitline and a control electrode coupled to the second split wordline; and
    a second ferroelectric capacitor between a first electrode of the second transistor and the first split wordline.

14. A nonvolatile ferroelectric memory device, comprising:
    a first split wordline driver;
    first and second cell arrays, wherein the first split wordline driver is between the cell arrays to drive wordlines thereof;
    first amplification stages each respectively positioned on at least one side of a corresponding one of the cell arrays, wherein the first amplification stages are coupled to bitlines of the respective cell arrays;
    a first data bus coupled to each of the first amplification stages;
    a second amplification stage coupled to the first data bus wherein the second amplification stage amplifies a data for at least two bitline pairs of the plurality of bitlines;
    a second data bus coupled to the second amplification stage; and
    a third amplification stage coupled to the second data bus.

15. The nonvolatile ferroelectric memory device of claim 14, wherein half of the first amplification stages are each positioned at opposing upper and lower sides of the first and second cell arrays, and wherein pairs of the first data buses are coupled to the upper first amplification stages and the lower first amplification stages, respectively.

16. The nonvolatile ferroelectric memory device of claim 15, wherein the first data buses used by the first amplification stages disposed in the upper and lower sides of the cell arrays transfer n/2 bits and the second data bus transfers n bits, where n is an integer greater than 1.

17. The nonvolatile ferroelectric memory device of claim 14, wherein an output signal of the third amplification stage is applied to input/output pads, and wherein the third amplification stage includes a plurality of second sensing amplifiers equal in number to the input/output pads.

18. The nonvolatile ferroelectric memory device of claim 14, wherein the first amplification stage includes a plurality of first sensing amplifiers respectively coupled to a corresponding one of the bitlines in each of the first and second cell arrays.

19. The nonvolatile ferroelectric memory device of claim 14, comprising:

a second split wordline driver;

third and fourth cell arrays arranged in a, matrix with the first and second cell arrays, wherein the second split wordline driver is between the third and fourth cell arrays to drive wordlines thereof, wherein the first amplification stages are positioned at upper and lower opposing sides of the cell arrays;

pairs of the first data buses each coupled to one of the upper and lower first amplification stages in each row of the cell arrays;

a plurality of second amplification units comprising the second amplification stage, each second amplification unit coupled to at least the pair of the first data buses of said each row of the cell arrays; and a plurality of first switches each coupled between one of the second amplification units and the second data bus.

20. The nonvolatile ferroelectric memory device of claim 19, comprising:

a plurality of second switches each coupled to one of the first data buses; and a plurality of third data buses each coupled between a corresponding one of a plurality of groups divided from the second switches and one of the second amplification units.

21. The nonvolatile ferroelectric memory device of claim 14, comprising:

a second split wordline driver;

third and fourth cell arrays arranged in a matrix with the first and second cell arrays, wherein the second split wordline driver is between the third and fourth cell arrays to drive wordlines thereof, wherein the first amplification stages are positioned at upper and lower opposing sides of the cell arrays;

pairs of the first data buses each coupled to one of the upper and lower first amplification stages in each row of the cell arrays;

first switches each coupled to one of the pair of data lines; and a third data bus coupled between the first switches and the second amplification stage.

22. The nonvolatile ferroelectric memory device of claim 14, wherein a cell of the memory device comprises:

a first and a second split wordlines extending along one direction at first intervals;

a first and a second bitlines extending along a second direction to cross the first and second split wordlines at second intervals;

a first transistor having a second electrode coupled to the first bitline and a control electrode coupled to the first split wordline;

a first ferroelectric capacitor between a first electrode of the first transistor and the second split wordline;

a second transistor having a second electrode coupled to the second bitline and a control electrode coupled to the second split wordline; and a second ferroelectric capacitor between a first electrode of the second transistor and the first split wordline.

\* \* \* \* \*